(12) United States Patent
Amano et al.

(10) Patent No.: US 11,611,004 B2
(45) Date of Patent: Mar. 21, 2023

(54) OPTO-ELECTRONIC INTEGRATED CIRCUIT AND COMPUTING APPARATUS

(71) Applicants: NATIONAL INSTITUTE OF ADVANCED INDUSTRIAL SCIENCE AND TECHNOLOGY, Tokyo (JP); PHOTONICS ELECTRONICS TECHNOLOGY RESEARCH ASSOCIATION, Tokyo (JP)

(72) Inventors: Takeru Amano, Ibaraki (JP); Akihiro Noriki, Ibaraki (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 663 days.

(21) Appl. No.: 16/608,801

(22) PCT Filed: Feb. 19, 2018

(86) PCT No.: PCT/JP2018/005748
§ 371 (c)(1),
(2) Date: Oct. 25, 2019

(87) PCT Pub. No.: WO2018/198490
PCT Pub. Date: Nov. 1, 2018

(65) Prior Publication Data
US 2021/0104637 A1    Apr. 8, 2021

(30) Foreign Application Priority Data
Apr. 28, 2017  (JP) .............................. JP2017-089878

(51) Int. Cl.
*H01L 31/0232*   (2014.01)
*G02B 6/43*   (2006.01)
(Continued)

(52) U.S. Cl.
CPC ............ *H01L 31/0232* (2013.01); *G02B 6/43* (2013.01); *H01S 5/022* (2013.01); *H01L 27/15* (2013.01)

(58) Field of Classification Search
CPC ... H01L 31/0232; H01L 27/15; H01L 3/4688; H01S 5/022; H05K 1/185; G02B 6/43; G02B 6/428
(Continued)

(56) References Cited

U.S. PATENT DOCUMENTS 9,490,240 B2    11/2016  Lucero et al.
2015/0003841 A1*  1/2015  McLaren et al. ........ G02B 6/43
                                                       398/141

FOREIGN PATENT DOCUMENTS

EP          1020748  A1    7/2000
JP       2002006161  A     1/2002
(Continued)

OTHER PUBLICATIONS

The Japan Patent Office, Notice of Reasons for Refusal, Japanese Patent Application No. 2019-515111, dated May 10, 2022, 12 pages.
(Continued)

*Primary Examiner* — Thinh T Nguyen
(74) *Attorney, Agent, or Firm* — Fenwick & West LLP

(57) ABSTRACT

A circuit board (100) has a first surface (102). A semiconductor chip (200) (first semiconductor chip) is located at the first surface side (102) of the circuit board (100). An insulating layer (300) covers the first surface (102) of the circuit board (100) and the semiconductor chip (200). A conductive path (310) (first conductive path) is electrically connected to the semiconductor chip (200) and extends in the insulating layer (300). A waveguide (320) is optically coupled to the semiconductor chip (200) and extends in the insulating layer (300).

5 Claims, 26 Drawing Sheets

(51) Int. Cl.
    *H01S 5/022*    (2021.01)
    *H01L 27/15*    (2006.01)

(58) Field of Classification Search
    USPC .......................................................... 257/685
    See application file for complete search history.

(56) References Cited

FOREIGN PATENT DOCUMENTS

| | | |
|---|---|---|
| JP | 2004146603 A | 5/2004 |
| JP | 2004-233991 A | 8/2004 |
| JP | 2006-323317 A | 11/2006 |
| JP | 2007517248 A | 6/2007 |
| JP | 2009536361 A | 10/2009 |
| JP | 2012043999 A | 3/2012 |
| JP | 2016-009151 A | 1/2016 |
| WO | WO 2005/045925 A1 | 5/2005 |
| WO | WO 2007/114384 A1 | 10/2007 |
| WO | WO 2013/101184 A1 | 4/2013 |

OTHER PUBLICATIONS

PCT International Search Report (with English Translation) and Written Opinion, International Application No. PCT/JP2018/005748, dated Apr. 10, 2018, 13 Pages.

\* cited by examiner

FIG. 4
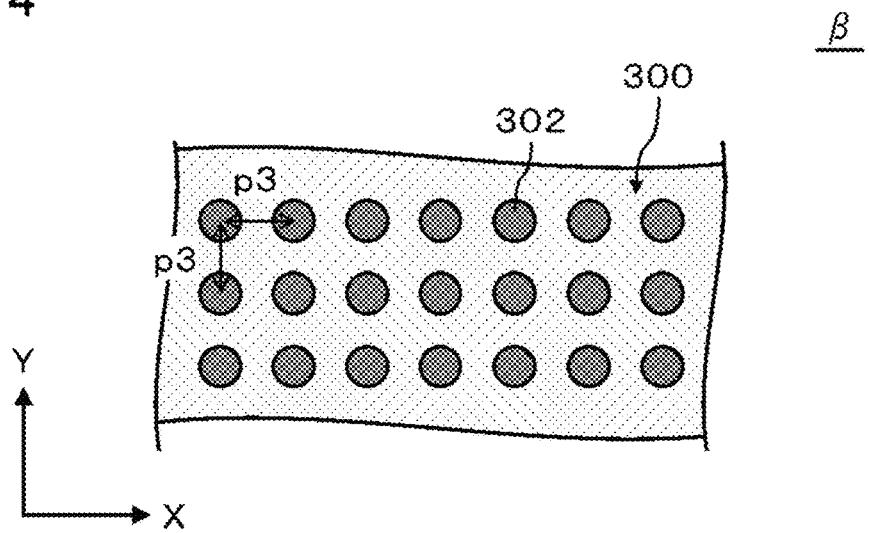
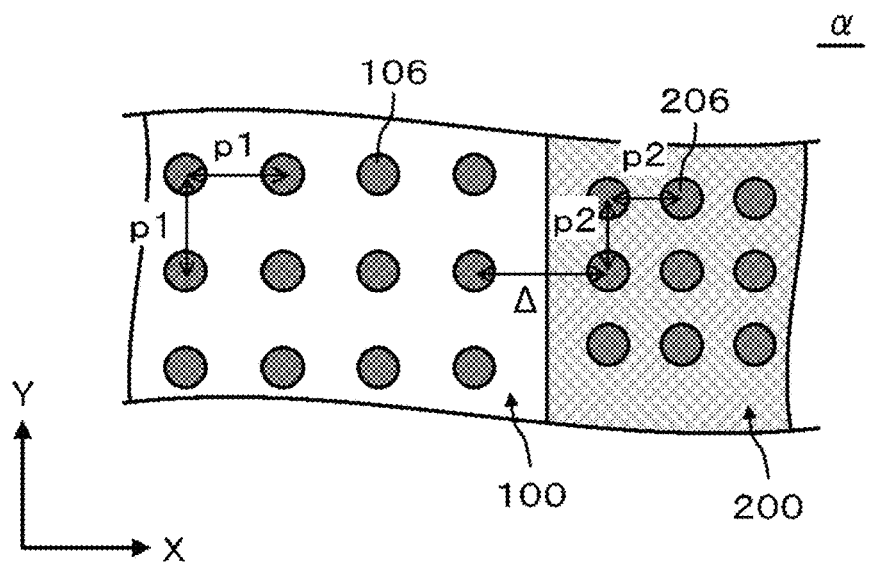
FIG. 5
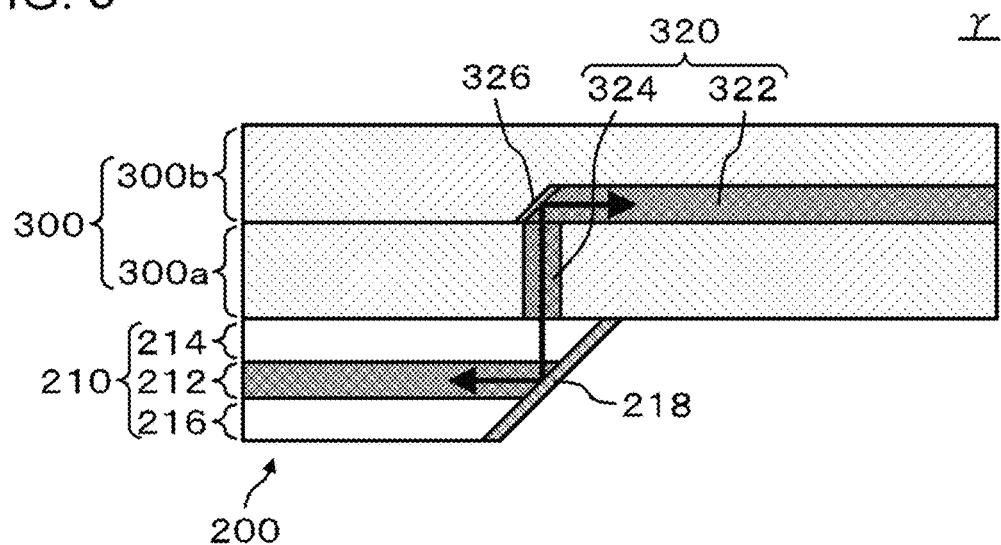

OPTO-ELECTRONIC INTEGRATED CIRCUIT AND COMPUTING APPARATUS

TECHNICAL FIELD

The present invention relates to an opto-electronic integrated circuit and a computing device.

BACKGROUND ART

In recent years, research and development on an opto-electronic integrated circuit for use in a computing device (for example, a server) have progressed in response to demands for broadband communication, and silicon photonics has attracted particular attention. In the silicon photonics, optical elements (for example, a laser diode (LD), a photodiode (PD), and a modulator or a waveguide) are formed on a silicon substrate by using a large-scale integration (LSI) technique, and the silicon substrate is mounted on a circuit board.

Patent Document 1 discloses an example of an opto-electronic integrated circuit. The opto-electronic integrated circuit in the example has a circuit board, a polymer waveguide, and a silicon photonics chip. The polymer waveguide is disposed on the circuit board. The silicon photonics chip is mounted on the polymer waveguide, and is optically coupled to the polymer waveguide. The silicon photonics chip is electrically connected to the circuit board by using a via penetrating through the polymer waveguide.

Patent Document 2 discloses an example of an opto-electronic integrated circuit. In this example, the opto-electronic integrated circuit has a circuit board, a planar lightwave circuit (PLC), and a transmission (TX) chip. The PLC is mounted on the circuit board. The TX chip is mounted on the PLC. The TX chip is electrically connected to the circuit board through a through-silicon via (TSV) penetrating through the PLC.

RELATED DOCUMENT

Patent Document

[Patent Document 1] Japanese Unexamined Patent Publication No. 2016-9151
[Patent Document 2] International Publication No. WO2013/101184

SUMMARY OF THE INVENTION

Technical Problem

The present inventor has examined a method of aligning elements optically coupled to each other in an opto-electronic integrated circuit. It is necessary to accurately align elements in order to exchange optical signals between the elements. Particularly, when optical signals in a single mode are exchanged, more accurate alignment is required.

An object of the present invention is to align elements optically coupled to each other with high accuracy. Further objects of the present invention will become apparent from the following description of an embodiment.

Solution To Problem

According to an aspect of the present invention, there is provided an opto-electronic integrated circuit including:
a circuit board having a first surface;
a first semiconductor chip located at the first surface side of the circuit board;
an insulating layer covering the first surface of the circuit board and the first semiconductor chip;
a first conductive path electrically connected to the first semiconductor chip and extending in the insulating layer; and
a waveguide optically coupled to the first semiconductor chip and extending in the insulating layer.

According to another aspect of the present invention, there is provided an opto-electronic integrated circuit including:
a first semiconductor chip;
an insulating layer covering the first semiconductor chip;
a first conductive path electrically connected to the first semiconductor chip and extending in the insulating layer; and
a waveguide optically coupled to the first semiconductor chip and extending in the insulating layer,
in which the first conductive path includes a portion extending in a transverse direction with respect to a thickness of the insulating layer.

According to still another aspect of the present invention, there is provided a computing device including:
a system board having a main surface; and
an opto-electronic integrated circuit located over the main surface of the system board,
wherein the opto-electronic integrated circuit includes:
a circuit board having a first surface and a second surface opposite to the first surface, the circuit board being mounted over the system board such that the second surface faces the main surface of the system board;
a first semiconductor chip located at the first surface side of the circuit board;
an insulating layer covering the first surface of the circuit board and the first semiconductor chip;
a first conductive path electrically connected to the first semiconductor chip and extending in the insulating layer; and
a waveguide optically coupled to the first semiconductor chip and extending in the insulating layer.

Advantageous Effects of Invention

According to the aspect of the present invention, it is possible to align elements optically coupled to each other with high accuracy.

BRIEF DESCRIPTION OF THE DRAWINGS

The above-described object, and other objects, features, and advantages will become apparent throughout preferable embodiments described below and the accompanying drawings.

FIG. 4 is a diagram for explaining an example of a planar layout in a region α and a region β illustrated in FIG. 2.
FIG. 5 is a diagram illustrating a first example of details of a region γ illustrated in FIG. 2.

DESCRIPTION OF EMBODIMENTS

Figure 1:
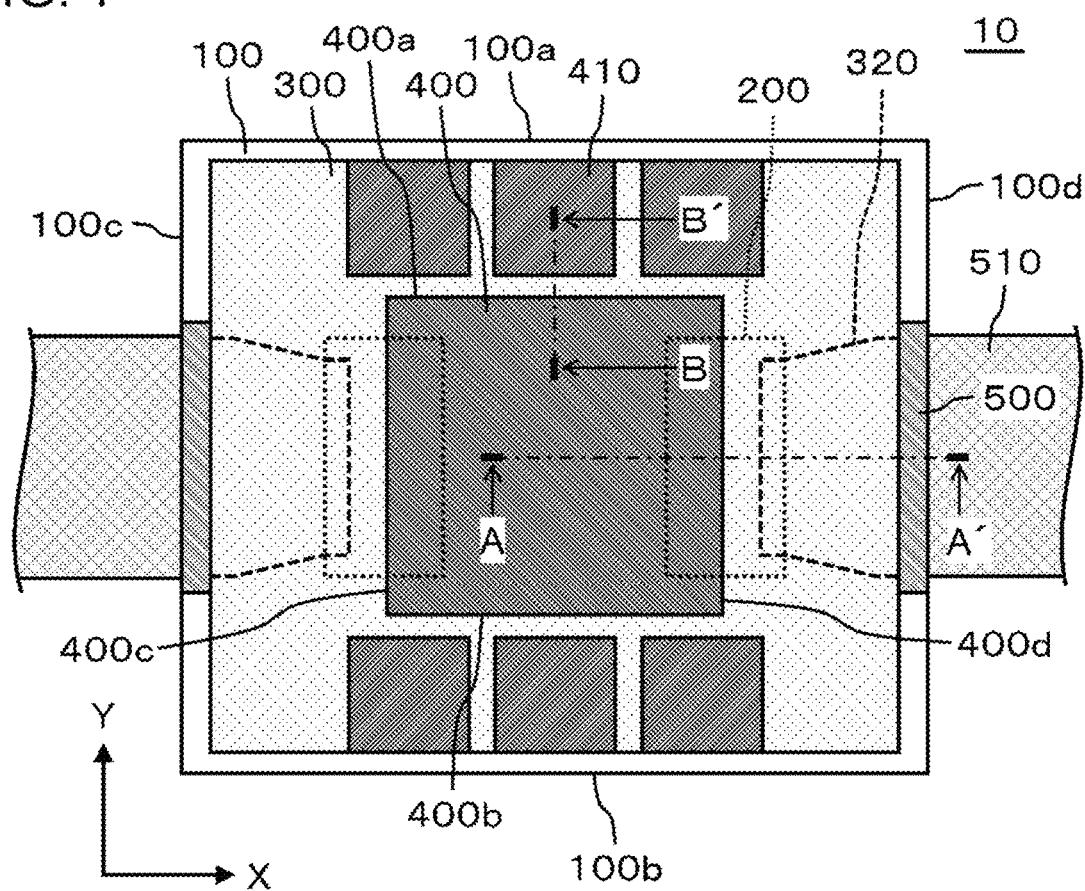
FIG. 1 is a plan view illustrating an opto-electronic integrated circuit according to Embodiment 1.

Hereinafter, embodiments of the present invention will be described with reference to the drawings. The similar constituent elements are given the similar reference numerals throughout all the drawings, and description thereof will not be repeated as appropriate.

In the embodiments, a mode of light propagating in an opto-electronic integrated circuit 10 is a single mode.

Embodiment 1

Figure 2:
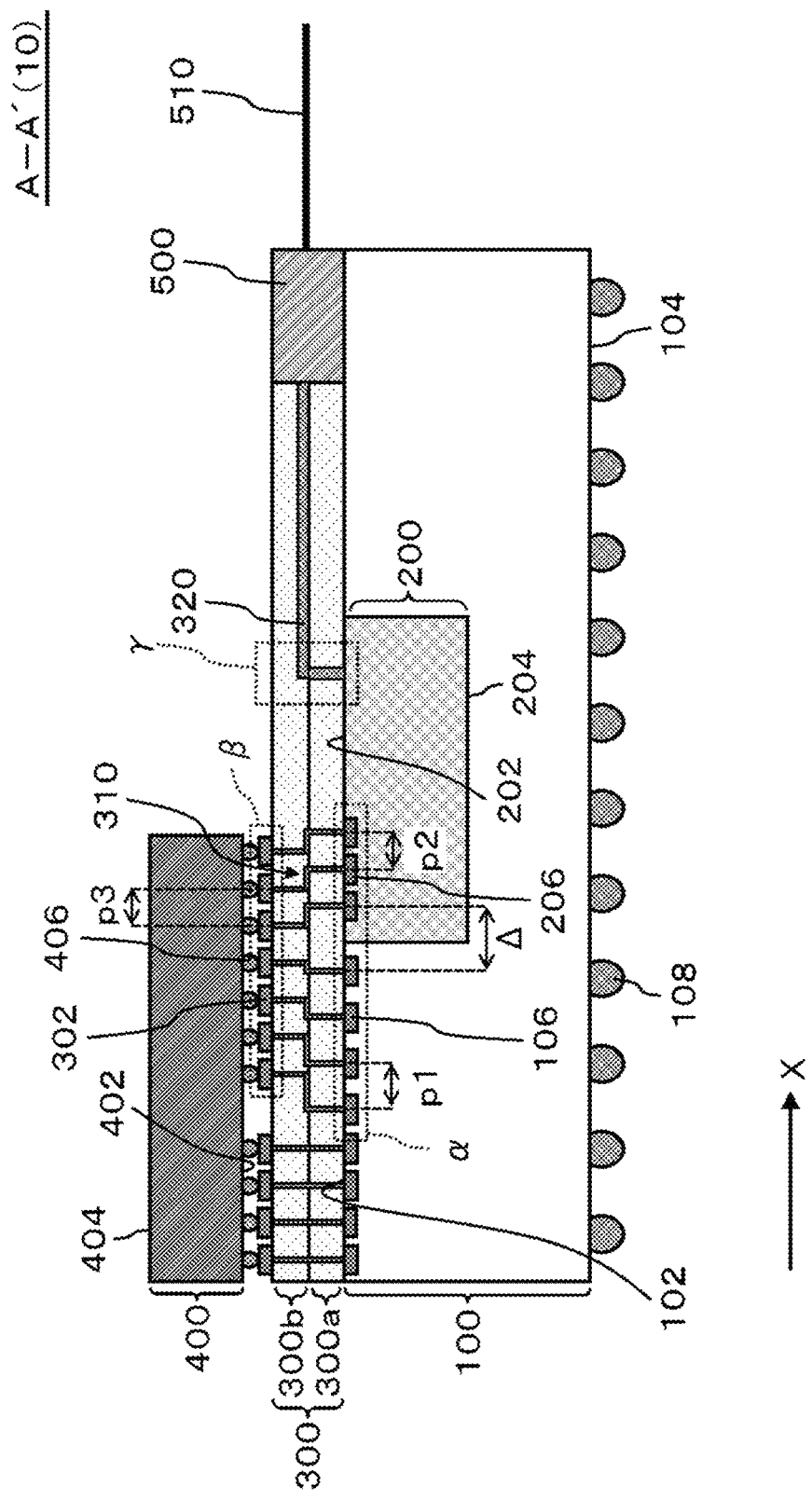
FIG. 2 is a sectional view taken along the line A-A' in FIG. 1.
Figure 3:
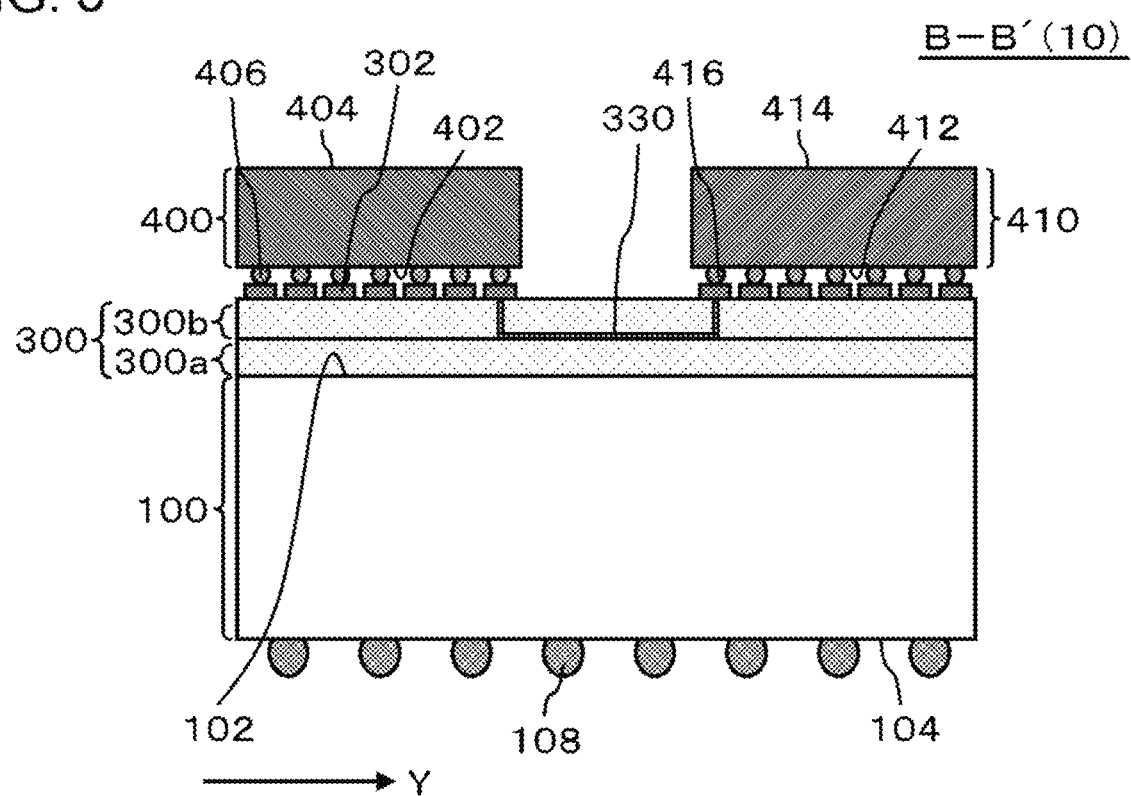
FIG. 3 is a sectional view taken along the line B-B' in FIG. 1.

FIG. 1 is a plan view illustrating the opto-electronic integrated circuit 10 according to Embodiment 1. FIG. 2 is a sectional view taken along the line A-A' in FIG. 1. FIG. 3 is a sectional view taken along the line B-B' in FIG. 1.

With reference to FIG. 2, a description will be made of a summary of the opto-electronic integrated circuit 10. The opto-electronic integrated circuit 10 includes a circuit board 100, a semiconductor chip 200, an insulating layer 300, a conductive path 310, and a waveguide 320. The circuit board 100 has a first surface 102. The semiconductor chip 200 (first semiconductor chip) is located at the first surface 102 side of the circuit board 100, and is buried into the first surface 102 of the circuit board 100 especially in the example illustrated in FIG. 2. The insulating layer 300 covers the first surface 102 of the circuit board 100 and the semiconductor chip 200. The conductive path 310 (first conductive path) is electrically connected to the semiconductor chip 200, and extends in the insulating layer 300. The waveguide 320 is optically coupled to the semiconductor chip 200, and extends in the insulating layer 300.

According to the configuration, elements optically coupled to each other, especially, the semiconductor chip 200 and the waveguide 320 can be aligned with high accuracy. Specifically, in the configuration, the circuit board 100 and the semiconductor chip 200 are covered with the insulating layer 300. Therefore, the circuit board 100 and the semiconductor chip 200 are integrated into each other through the insulating layer 300. The waveguide 320 is located in the insulating layer 300, that is, in the insulating layer formed by using an LSI technique. Therefore, the waveguide 320 maybe formed by using the large-scale integration (LSI) technique, in particular lithography. Therefore, the semiconductor chip 200 and the waveguide 320 can be aligned with high accuracy.

Next, a description will be made of an example of details of a planar layout of the opto-electronic integrated circuit 10 with reference to FIG. 1.

In the example illustrated in FIG. 1, the opto-electronic integrated circuit 10 includes the circuit board 100, two semiconductor chips 200, the insulating layer 300, two waveguides 320, a semiconductor chip 400, a plurality of semiconductor chips 410, two optical connectors 500, and two optical fibers 510.

A shape of the circuit board 100 is a substantially rectangular. The circuit board 100 has a first side 100a, a second side 100b, a third side 100c, and a fourth side 100d. The first side 100a extends along an X direction. The second side 100b extends along the X direction, opposite to the first side 100a. The third side 100c extends along a Y direction between the first side 100a and the second side 100b. The fourth side 100*d* extends along the Y direction between the first side 100*a* and the second side 100*b*, opposite to the third side 400*c*.

The insulating layer 300 overlaps the circuit board 100. Each semiconductor chip 200 is covered with the insulating layer 300, each waveguide 320 extends in the insulating layer 300, and the semiconductor chip 400 and each semiconductor chip 410 overlap the insulating layer 300.

The semiconductor chip 400 is located substantially at the center of the circuit board 100. In the same manner as the shape of the circuit board 100, a shape of the semiconductor chip 400 is a substantially rectangular. The semiconductor chip 400 has a first side 400*a*, a second side 400*b*, a third side 400*c*, and a fourth side 400*d*. The first side 400*a* extends along the X direction. The second side 400*b* extends along the X direction, opposite to the first side 400*a*. The third side 400*c* extends along the Y direction between the first side 400*a* and the second side 400*b*. The fourth side 400*d* extends along the Y direction between the first side 400*a* and the second side 400*b*, opposite to the third side 400*c*.

Some semiconductor chips 410 of the plurality of semiconductor chips 410 are arranged along the first side 400*a* of the semiconductor chip 400, and some other semiconductor chips 410 of the plurality of semiconductor chips 410 are arranged along the second side 400*b* of the semiconductor chip 400.

One of the two semiconductor chips 200 extends outwards from the inside of the semiconductor chip 400 over the third side 400*c* of the semiconductor chip 400. The other of the two semiconductor chips 200 extends outwards from the inside of the semiconductor chip 400 over the fourth side 400*d* of the semiconductor chip 400.

One of the two waveguides 320 extends toward the third side 100*c* of the circuit board 100 from the semiconductor chip 200 at the third side 400*c* side of the semiconductor chip 400, and optically couples the semiconductor chip 200 at the third side 400*c* side of the semiconductor chip 400 to the optical connector 500 and the optical fiber 510. The other of the two waveguides 320 extends toward the fourth side 400*d* of the circuit board 100 from the semiconductor chip 200 at the fourth side 400*d* side of the semiconductor chip 400, and optically couples the semiconductor chip 200 at the fourth side 400*d* side of the semiconductor chip 400 to the optical connector 500 and the optical fiber 510.

Next, with reference to FIG. 2, a description will be made of details of a section of the opto-electronic integrated circuit 10.

The circuit board 100 is a printed circuit board (PCB). The circuit board 100 has the first surface 102 and a second surface 104. The second surface 104 is opposite to the first surface 102. The circuit board 100 has a plurality of electrodes 106 at the first surface 102 side. The circuit board 100 has a plurality of bumps 108 at the second surface 104 side. Particularly, in the example illustrated in FIG. 2, the circuit board 100 is a ball grid array (BGA), and the plurality of bumps 108 is disposed in a grid form.

Each of the semiconductor chips 200 is a photonic integrated circuit (PIC), and is, more specifically, a silicon photonics chip. The semiconductor chip 200 has a first surface 202 and a second surface 204. The second surface 204 is opposite to the first surface 202. The semiconductor chip 200 has a plurality of electrodes 206 at the first surface 202 side. The semiconductor chip 200 is buried into the first surface 102 of the circuit board 100 such that the first surface 202 is exposed from the first surface 102 of the circuit board 100. Particularly, in the example illustrated in FIG. 2, the first surface 202 of the semiconductor chip 200 is substantially coplanar with the first surface 102 of the circuit board 100. In an example, the semiconductor chip 200 is formed of a silicon substrate or a silicon on insulator (SOI) substrate. Optical elements (for example, a laser diode (LD), a photodiode (PD), a modulator, and a waveguide) are formed on the first surface 202 of the semiconductor chip 200 by using the LSI technique.

The insulating layer 300 has two layers, that is, a layer 300*a* and a layer 300*b*. The layer 300*a* and the layer 300*b* have electrical insulation, and also have a refractive index higher than that of the waveguide 320. Therefore, the layer 300*a* and the layer 300*b* function as electrical wiring layers including the conductive path 310, and also function as clads of the waveguide 320 (that is, a core). In an example, the layer 300*a* and the layer 300*b* are made of a silicone resin. In another example, the layer 300*a* and the layer 300*b* may be made of an epoxy resin or a fluororesin.

The conductive path 310 has a three-dimensional structure, and specifically includes a portion extending in a direction along a thickness of the insulating layer 300 (that is, a portion functioning as a via) and a portion extending in a transverse direction with respect to the thickness of the insulating layer 300. Therefore, one end of the conductive path 310 and the other end of the conductive path 310 can be deviated from each other in the transverse direction with respect to the thickness of the insulating layer 300, and thus it is possible to increase the degree of freedom of an electrical connection structure with the conductive path 310. In an example, the conductive path 310 is made of metal, for example, copper.

The waveguide 320 optically couples the semiconductor chip 200 to the optical connector 500. Therefore, the light from the semiconductor chip 200 is sent to the optical connector 500 (optical fiber 510) through the waveguide 320, and the light from the optical connector 500 (optical fiber 510) is sent to the semiconductor chip 200 through the waveguide 320. The waveguide 320 is a polymer waveguide, and light is confined in the waveguide 320 by the layer 300*a* and the layer 300*b*.

The semiconductor chip 400 is a central processing unit (CPU) or a graphics processing unit (GPU). The semiconductor chip 400 has a first surface 402 and a second surface 404. The second surface 404 is opposite to the first surface 402. The semiconductor chip 400 has a plurality of bumps 406 on the first surface 402. The semiconductor chip 400 is mounted on the insulating layer 300 such that the first surface 402 faces the first surface 102 of the circuit board 100. The semiconductor chip 400 is flip-chip mounted on the insulating layer 300, and each of the plurality of bumps 406 of the semiconductor chip 400 is connected to each of a plurality of electrodes 302 on the insulating layer 300.

The semiconductor chip 400 (second semiconductor chip) is electrically connected to the circuit board 100 through the conductive path 310. One end of the conductive path 310 is connected to the electrode 106 of the circuit board 100, and the other end of the conductive path 310 is connected to the electrode 302 connected to the bump 406 of the semiconductor chip 400.

The semiconductor chip 400 is electrically connected to the semiconductor chip 200 through the conductive path 310. One end of the conductive path 310 is connected to the electrode 206 of the semiconductor chip 200, and the other end of the conductive path 310 is connected to the electrode 302 connected to the bump 406 of the semiconductor chip 400.

Next, with reference to FIG. 3, a description will be made of details of a section of the opto-electronic integrated circuit 10.

The semiconductor chip 410 is a memory chip, for example, a high bandwidth memory (HBM), and includes a plurality of stacked dies. The semiconductor chip 410 has a first surface 412 and a second surface 414. The second surface 414 is opposite to the first surface 412.

The semiconductor chip 410 has a plurality of bumps 416 on the first surface 412. The semiconductor chip 410 is mounted on the insulating layer 300 such that the first surface 412 faces the first surface 102 of the circuit board 100. The semiconductor chip 410 is flip-chip mounted on the insulating layer 300, and each of the plurality of bumps 416 of the semiconductor chip 410 is connected to each of the plurality of electrodes 302 on the insulating layer 300.

The semiconductor chip 410 is electrically connected to the semiconductor chip 400 through a conductive path 330. The conductive path 330 extends in the insulating layer 300 in the same manner as the conductive path 310. One end of the conductive path 330 is connected to the electrode 302 connected to the semiconductor chip 400, and the other end of the conductive path 330 is connected to the electrode 302 connected to the semiconductor chip 410.

FIG. 4 is a diagram for explaining an example of a planar layout in a region α and a region β illustrated in FIG. 2.

The plurality of electrodes 106 of the circuit board 100 is disposed in a grid form with a pitch p1 in the X direction and a pitch p1 in the Y direction, the plurality of electrodes 206 of the semiconductor chip 200 is disposed in a grid form with a pitch p2 in the X direction and a pitch p2 in the Y direction, and the plurality of electrodes 302 on the insulating layer 300 is disposed in a grid form with a pitch p3 in the X direction and a pitch p3 in the Y direction.

In the examples illustrated in FIGS. 2 and 4, the pitches of the plurality of electrodes 106 and the plurality of electrodes 206 are converted into the pitch of the plurality of electrodes 302 by the conductive paths 310. Specifically, the conductive path 310 includes the portion extending in the transverse direction with respect to the thickness of the insulating layer 300. Therefore, one end of the conductive path 310 (the electrode 106 or the electrode 206) and the other end of the conductive path 310 (electrode 302) can be deviated from each other in the transverse direction with respect to the thickness of the insulating layer 300. Therefore, the pitches of the plurality of electrodes 106 and the plurality of electrodes 206 can be converted into the pitch of the plurality of electrodes 302.

Particularly, in examples illustrated in FIGS. 2 and 4, the different pitches of each electrode (the electrode 106 and the electrode 206) from the circuit board 100 to the semiconductor chip 200 can be unified into the pitch p3 of the plurality of electrodes 302. Specifically, the pitch p1 of the plurality of electrodes 106 can be converted into a pitch smaller than the pitch p1, that is, the pitch p3 (p3<p1) of the plurality of electrodes 302.

In the examples illustrated in FIGS. 2 and 4, a distance Δ (pitch) in the X direction between the electrode 106 closest to the plurality of electrodes 206 and the electrode 206 closest to the plurality of electrodes 106 can be converted into the pitch p3 of the plurality of electrodes 302, that is, a pitch shorter than the distance Δ (p3<Δ). Specifically, one end and the other end of one conductive path 310 (first conductive path) of the plurality of conductive paths 310 are respectively connected to the electrode 206 and the electrode 302, and one end and the other end of another waveguide 320 (second conductive path) of the plurality of waveguides 320 are respectively connected to the electrode 106 and the electrode 302. A distance between the other end of the first conductive path and the other end of the second conductive path (that is, the pitch p3) is shorter than a distance between one end of the first conductive path and one end of the second conductive path (that is, the distance Δ).

FIG. 5 is a diagram illustrating a first example of details of a region γ illustrated in FIG. 2. In this example, the semiconductor chip 200 has a waveguide 210, and the insulating layer 300 has the waveguide 320.

The waveguide 210 has a core layer 212, a clad layer 214, and a clad layer 216. The core layer 212 is located between the clad layer 214 and the clad layer 216. In an example, the core layer 212 is a SiON layer, and the clad layer 214 and the clad layer 216 are SiO$_2$ layers.

The waveguide 320 has a first path 322 and a second path 324. The first path 322 extends in the transverse direction with respect to the thickness of the insulating layer 300, and the second path 324 extends in the direction along the thickness of the insulating layer 300.

The waveguide 210 and the waveguide 320 are optically coupled to each other by a mirror 218 and a mirror 326. In the example illustrated in FIG. 5, the mirror 218 is a flat mirror and is provided at the end of the waveguide 210, and the mirror 326 is a flat mirror and is provided at the end of the first path 322. The light propagating through the waveguide 210 is reflected by the mirror 218 to propagate through the second path 324, and is reflected by the mirror 326 to be sent to the first path 322. The light propagating through the first path 322 is reflected by the mirror 326 to propagate through the second path 324, and is reflected by the mirror 218 to be sent to the waveguide 210.

Figure 6:
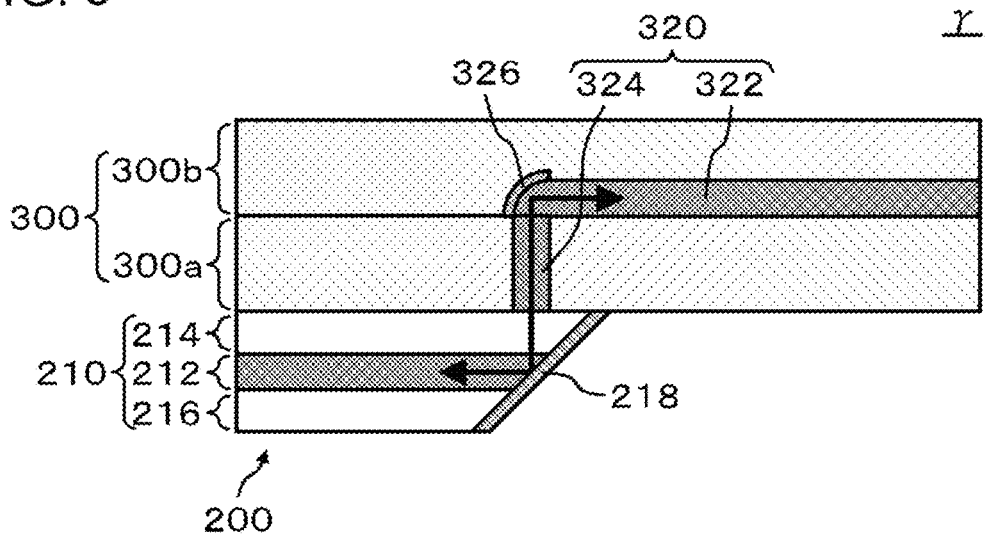
FIG. 6 is a diagram illustrating a second example of details of the region γ illustrated in FIG. 2.

FIG. 6 is a diagram illustrating a second example of details of the region γ illustrated in FIG. 2. As illustrated in FIG. 6, the mirror 326 may be a curved mirror having a light collecting effect.

Figure 7:
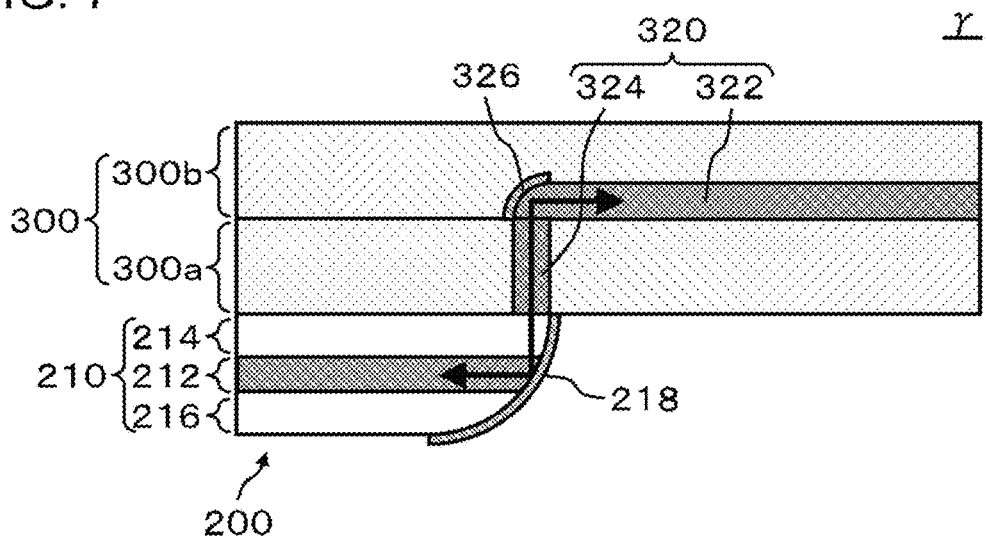
FIG. 7 is a diagram illustrating a third example of details of the region γ illustrated in FIG. 2.

FIG. 7 is a diagram illustrating a third example of details of the region γ illustrated in FIG. 2. As illustrated in FIG. 7, both of the mirror 218 and the mirror 326 may be curved mirrors having a light collecting effect.

Figure 8:
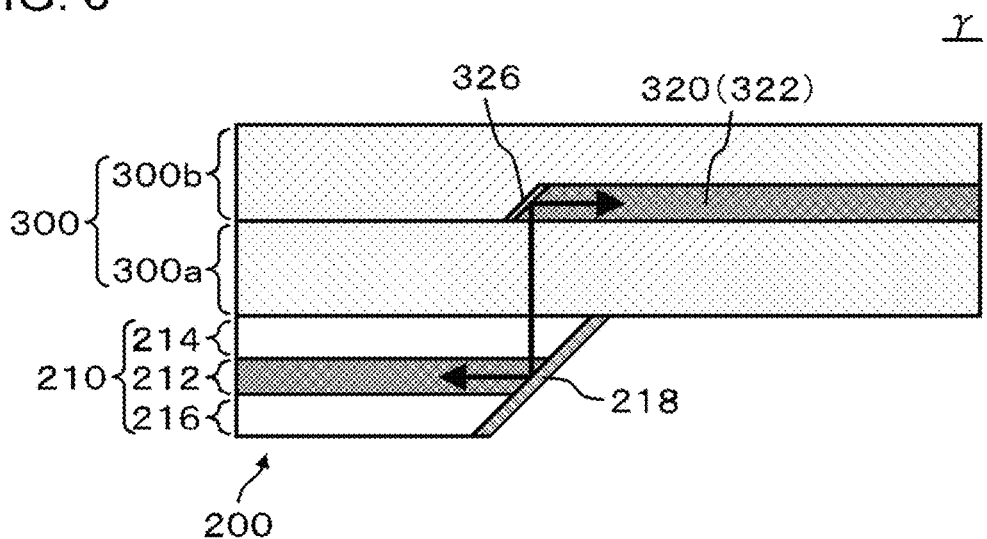
FIG. 8 is a diagram illustrating a fourth example of details of the region γ illustrated in FIG. 2.

FIG. 8 is a diagram illustrating a fourth example of details of the region γ illustrated in FIG. 2. As illustrated in FIG. 8, the second path 324 (for example, FIG. 5) may not be provided. In this example, the light propagating through the waveguide 210 is reflected by the mirror 218 to propagate through the layer 300a, and is sent to the waveguide 320 (first path 322). The light propagating through the waveguide 320 (first path 322) is reflected by the mirror 326 to propagate through the layer 300a, and is sent to the waveguide 210.

Figure 9:
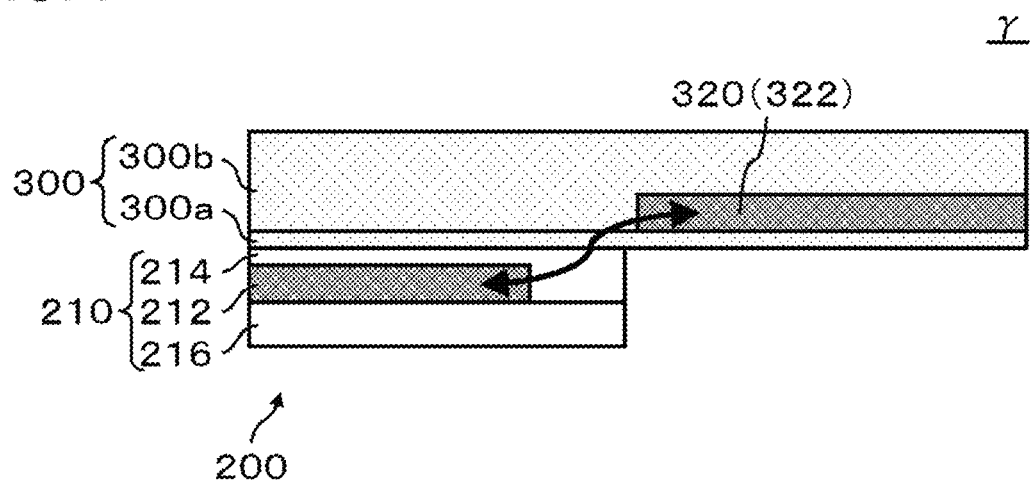
FIG. 9 is a diagram illustrating a fifth example of details of the region γ illustrated in FIG. 2.

FIG. 9 is a diagram illustrating a fifth example of details of the region γ illustrated in FIG. 2. As illustrated in FIG. 9, the core layer 212 of the waveguide 210 and the waveguide 320 (first path 322) may be close to each other. Particularly, in the example illustrated in FIG. 9, the layer 300a covers the waveguide 210, and the thickness of the layer 300a is small. Therefore, the core layer 212 of the waveguide 210 and the waveguide 320 (first path 322) can be close to each other. In this example, the light emitted from the end of the core layer 212 can be incident to the end of the waveguide 320 (first path 322), and the light emitted from the end of the waveguide 320 (first path 322) can be incident to the end of the core layer 212.

Figure 10:
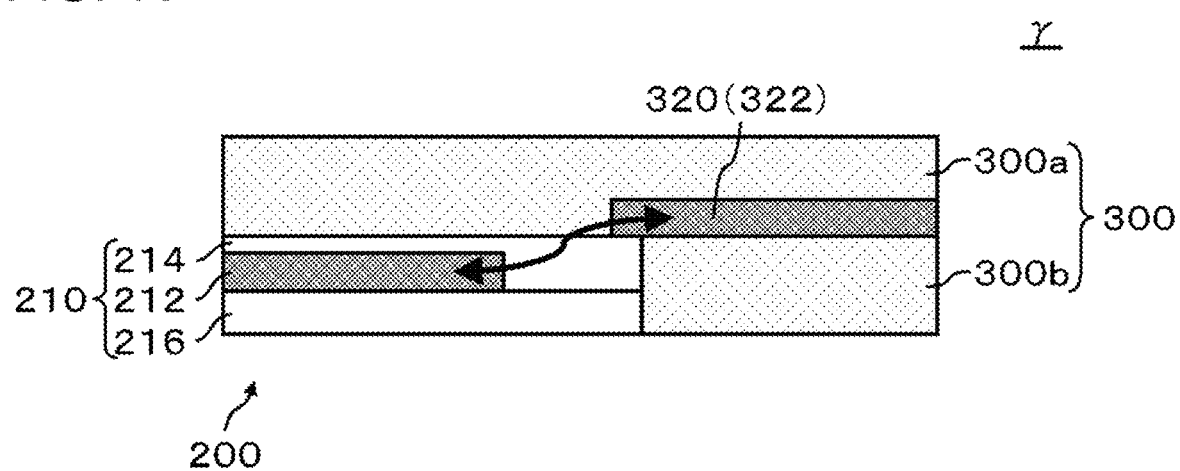
FIG. 10 is a diagram illustrating a sixth example of details of the region γ illustrated in FIG. 2.

FIG. 10 is a diagram illustrating a sixth example of details of the region γ illustrated in FIG. 2. As illustrated in FIG. 10, the layer 300b may not cover the waveguide 210. In this example, the layer 300b is not located between the end of the core layer 212 and the end of the waveguide 320 (first path 322). Therefore, the core layer 212 of the waveguide 210 and the waveguide 320 (first path 322) can be further close to each other.

Figure 11:
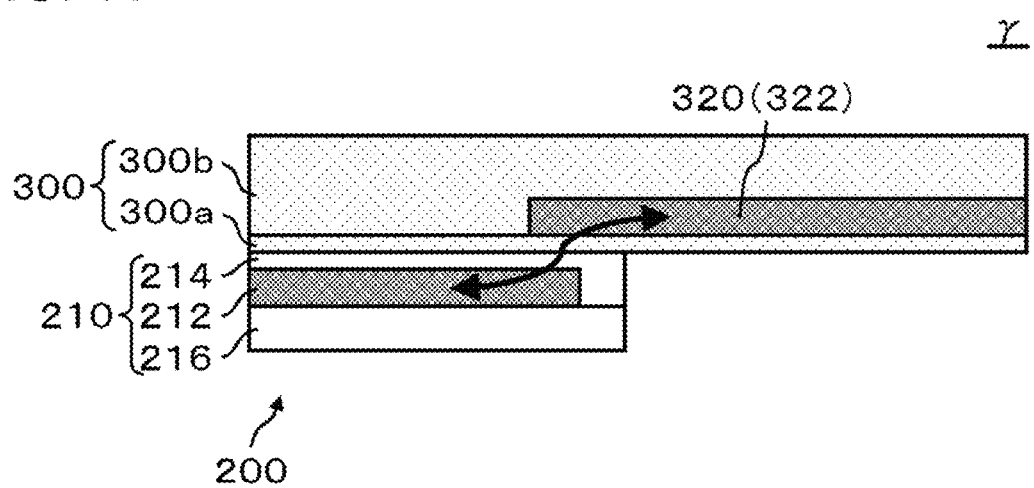
FIG. 11 is a diagram illustrating a seventh example of details of the region γ illustrated in FIG. 2.

FIG. 11 is a diagram illustrating a seventh example of details of the region γ illustrated in FIG. 2. The example illustrated in FIG. 11 is the same as the example illustrated in FIG. 9 except that a part of the core layer 212 of the waveguide 210 overlaps a part of the waveguide 320 (first path 322).

Figure 12:
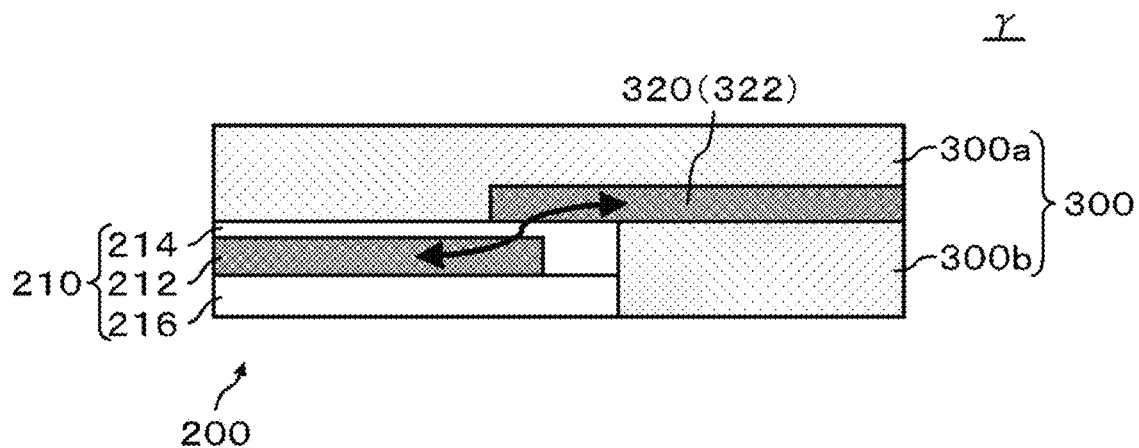
FIG. 12 is a diagram illustrating an eighth example of details of the region γ illustrated in FIG. 2.

FIG. 12 is a diagram illustrating an eighth example of details of the region γ illustrated in FIG. 2. The example illustrated in FIG. 12 is the same as the example illustrated in FIG. 10 except that a part of the core layer 212 of the waveguide 210 overlaps a part of the waveguide 320 (first path 322).

Figure 13:
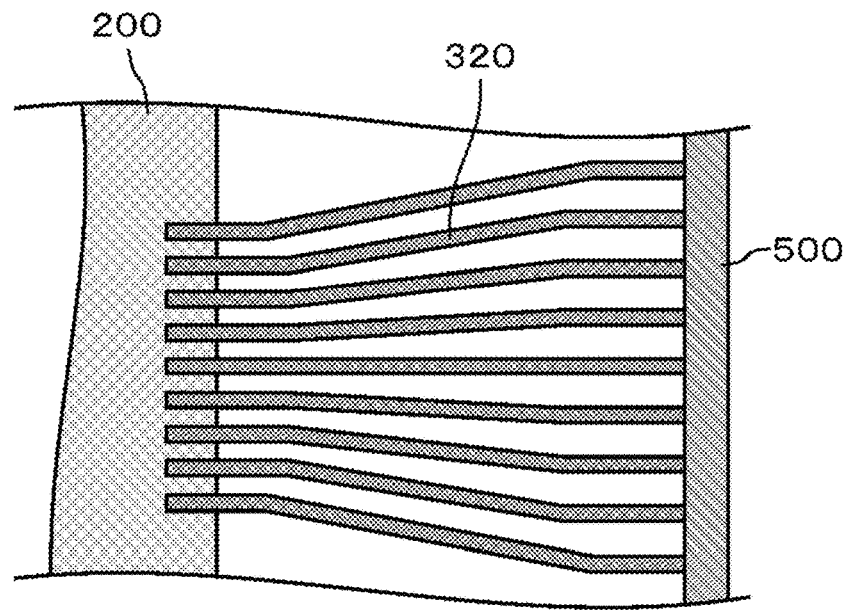
FIG. 13 is a diagram for explaining an example of details of a waveguide illustrated in FIG. 1.

FIG. 13 is a diagram for explaining an example of details of the waveguide 320 illustrated in FIG. 1. In this example, the semiconductor chip 200 is optically coupled to the optical connector 500 through the plurality of waveguides 320. A distance between the adjacent waveguides 320 is increased from the semiconductor chip 200 toward the optical connector 500. In other words, pitches of the plurality of waveguides 320 are converted between the semiconductor chip 200 side and the optical connector 500 side.

Figure 14:
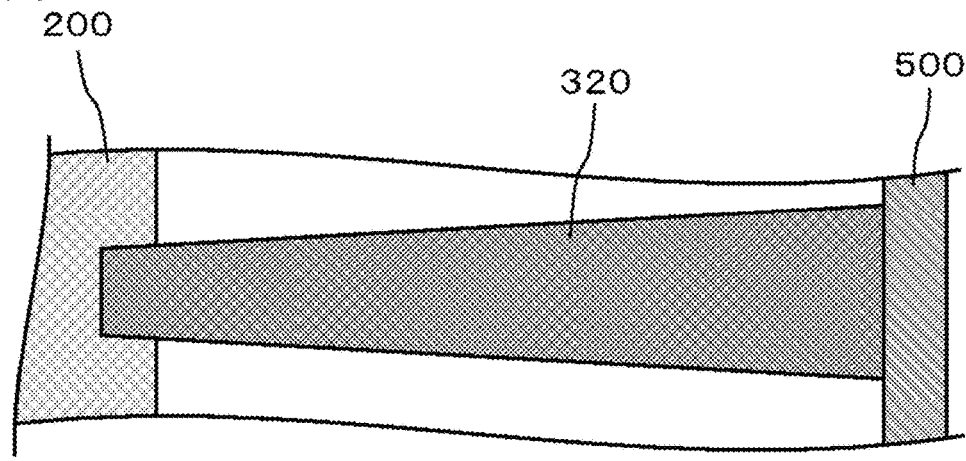
FIG. 14 is a diagram for explaining an example of details of one waveguide among a plurality of waveguides illustrated in FIG. 13.

FIG. 14 is a diagram for explaining an example of details of one waveguide 320 among the plurality of waveguides 320 illustrated in FIG. 13. In this example, a width of the waveguide 320 is increased from the semiconductor chip 200 toward the optical connector 500. Therefore, a diameter of a beam propagating through the waveguide 320 can be converted.

Each of FIGS. 15 to 20 is a diagram for explaining a first example of a method of manufacturing the opto-electronic integrated circuit 10 illustrated in FIGS. 1 to 3. In this example, the opto-electronic integrated circuit 10 is manufactured as follows.

Figure 15:
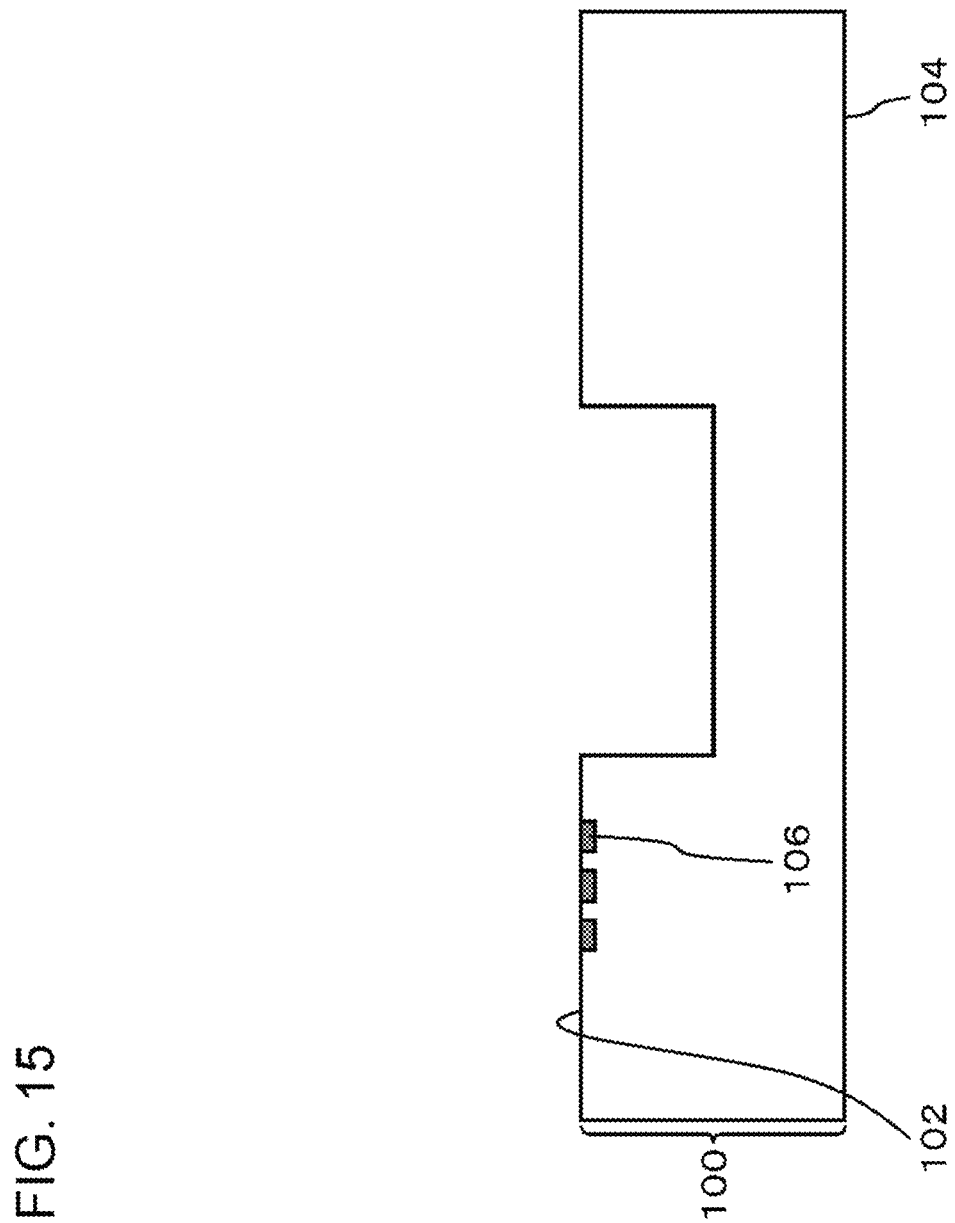
FIG. 15 is a diagram for explaining a first example of a method of manufacturing the opto-electronic integrated circuit illustrated in FIGS. 1 to 3.

First, as illustrated in FIG. 15, the circuit board 100 is prepared. The circuit board 100 has a recessed part at the first surface 102 side. Next, an uncured mold material is applied into the recessed part of the circuit board 100.

Figure 16:
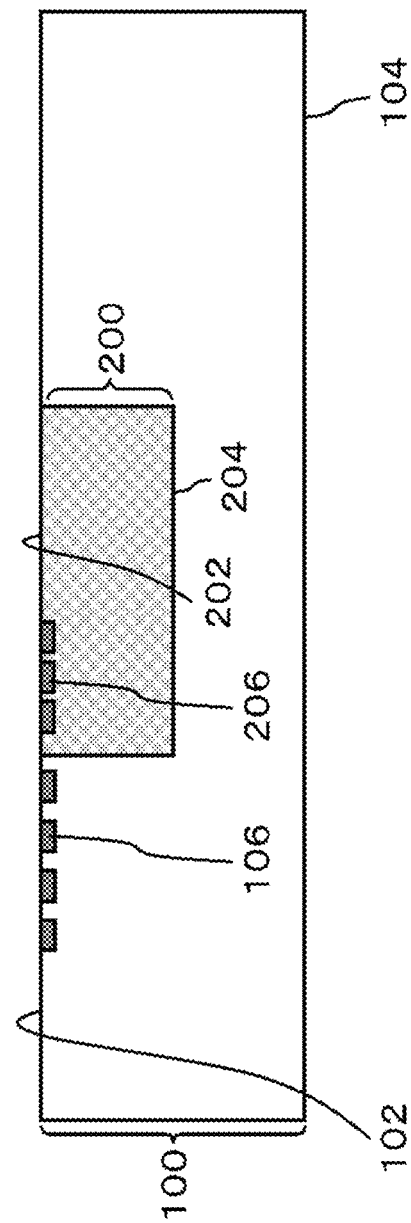
FIG. 16 is a diagram for explaining the first example of the method of manufacturing the opto-electronic integrated circuit illustrated in FIGS. 1 to 3.

Next, as illustrated in FIG. 16, the semiconductor chip 200 is buried into the recessed part of the circuit board 100. The mold material applied into the recessed part is cured to fix the semiconductor chip 200 to the circuit board 100. In this method, the semiconductor chip 200 can be aligned by the recessed part of the circuit board 100, and the semiconductor chip 200 can be bonded to the circuit board 100 by the mold material. Therefore, the semiconductor chip 200 can be aligned with high accuracy.

Figure 17:
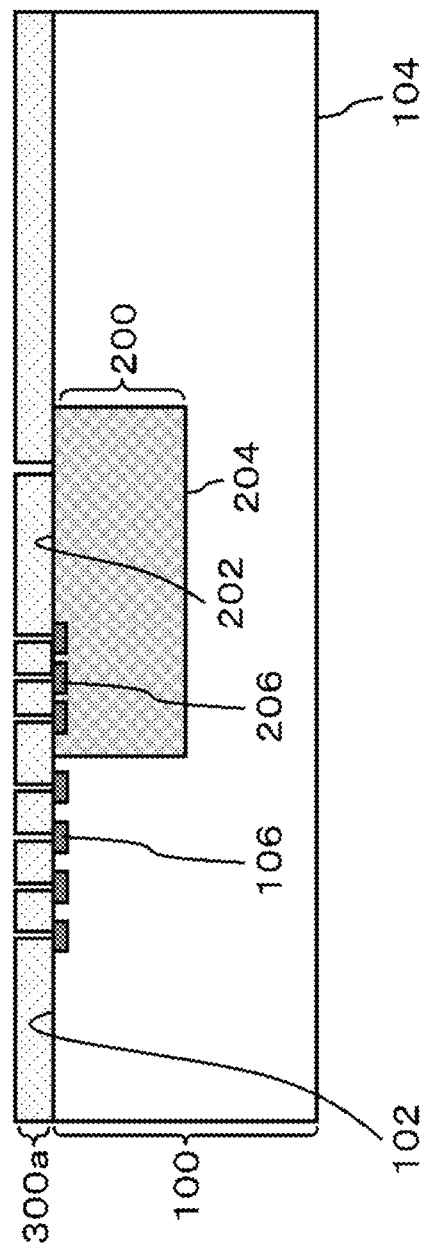
FIG. 17 is a diagram for explaining the first example of the method of manufacturing the opto-electronic integrated circuit illustrated in FIGS. 1 to 3.

Next, as illustrated in FIG. 17, the layer 300a is formed on the first surface 102 of the circuit board 100 and the semiconductor chip 200. Next, a through-hole into which the conductive path 310 (which will be described later with reference to FIG. 18) is to be buried and a through-hole into which a part of the waveguide 320 (which will be described later with reference to FIG. 19) is to be buried are formed in the layer 300a. The through-holes are formed by using the LSI technique, in particular lithography. Therefore, the through-holes can be aligned with high accuracy.

Figure 18:
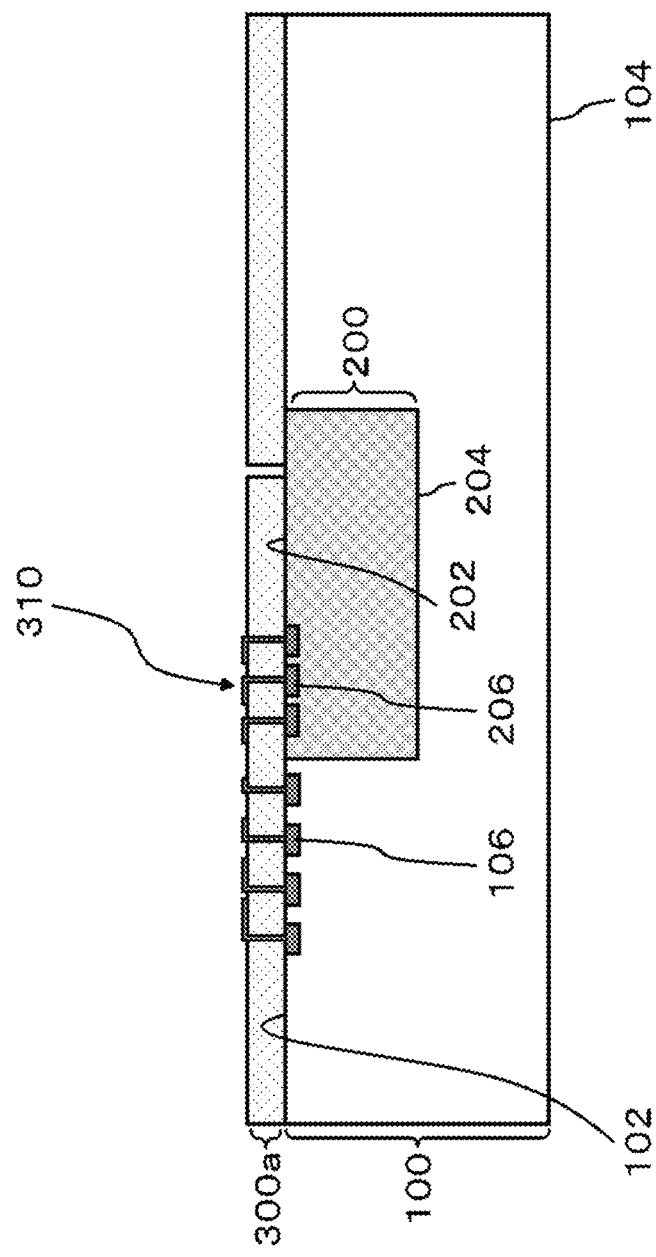
FIG. 18 is a diagram for explaining the first example of the method of manufacturing the opto-electronic integrated circuit illustrated in FIGS. 1 to 3.

Next, as illustrated in FIG. 18, the conductive path 310 is buried into the through-hole.

Figure 19:
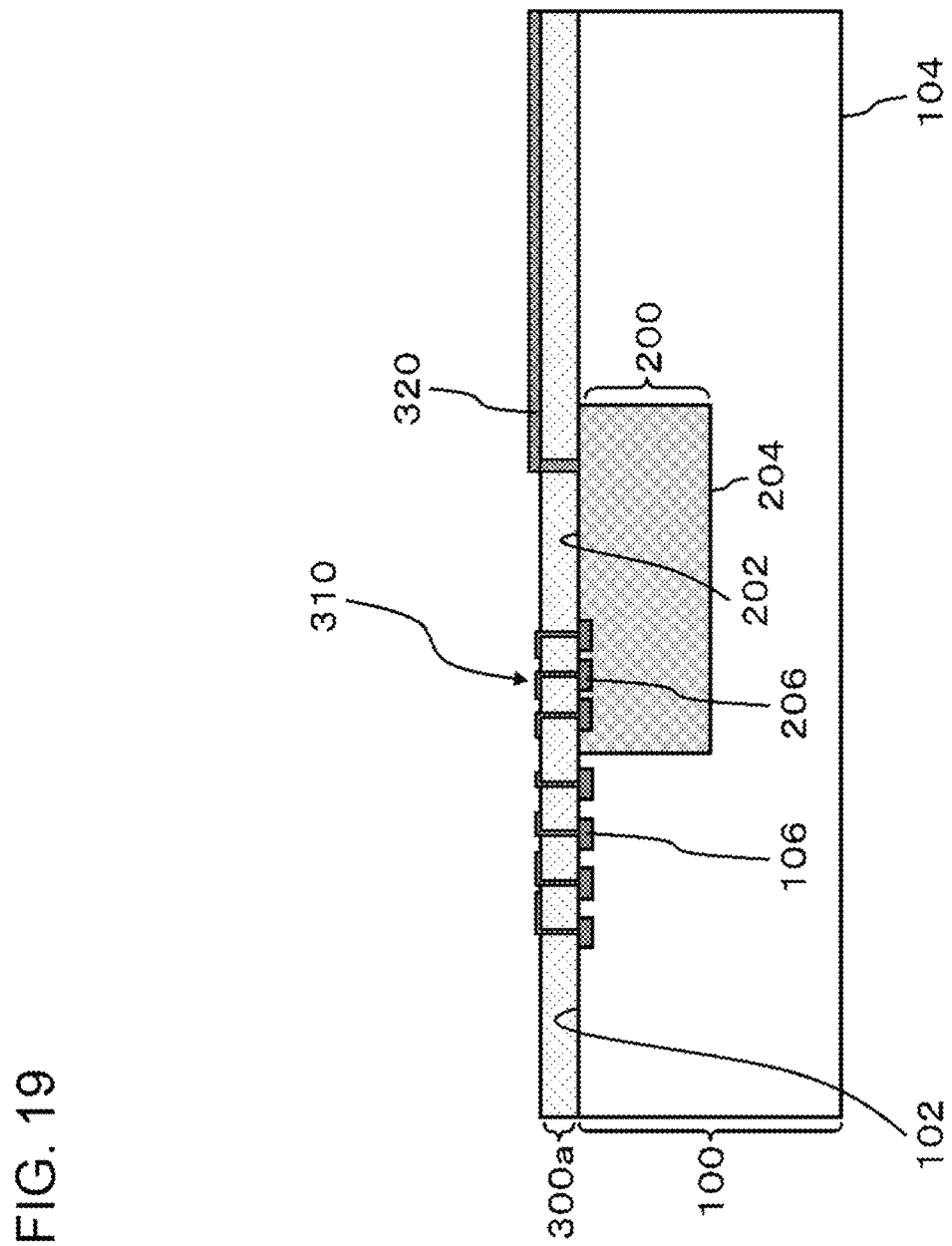
FIG. 19 is a diagram for explaining the first example of the method of manufacturing the opto-electronic integrated circuit illustrated in FIGS. 1 to 3.

Next, as illustrated in FIG. 19, the waveguide 320 is formed. In this example, a part of the waveguide 320 is buried into the waveguide 320 as described with reference to FIG. 5, for example. However, as described with reference to FIG. 8, a through-hole into which the waveguide 320 is buried may not be provided.

Figure 20:
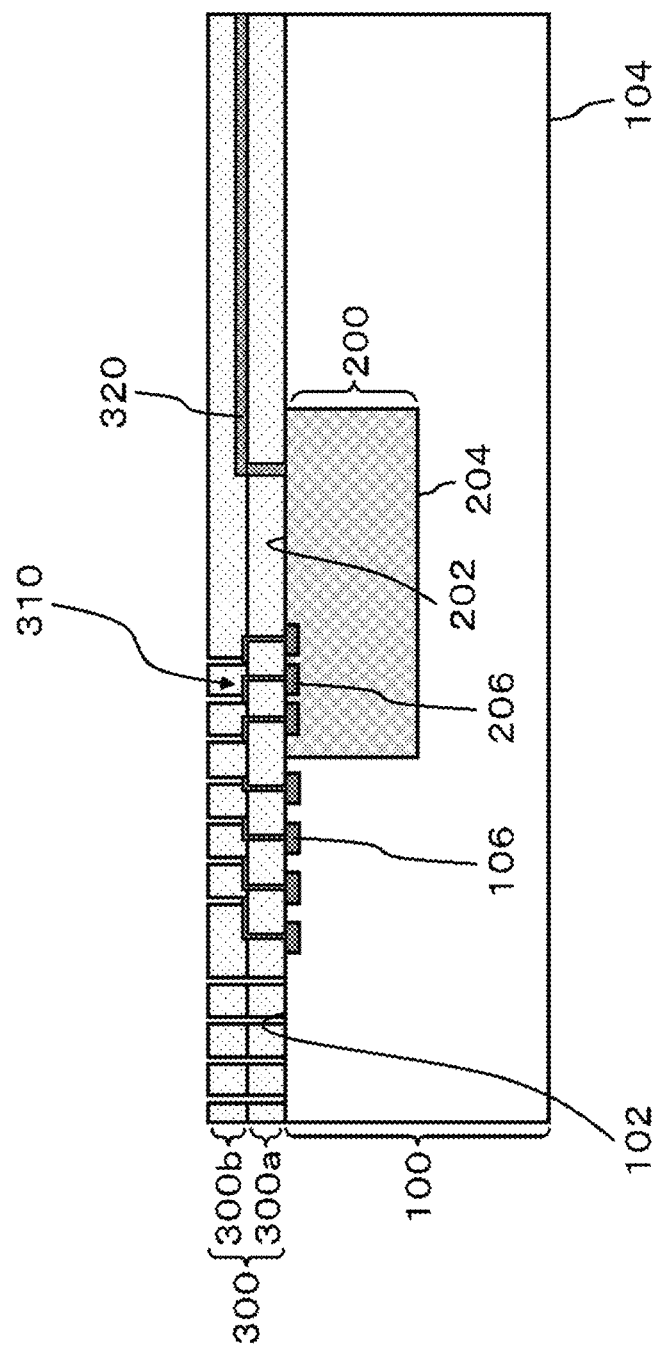
FIG. 20 is a diagram for explaining the first example of the method of manufacturing the opto-electronic integrated circuit illustrated in FIGS. 1 to 3.

Next, as illustrated in FIG. 20, the layer 300b is formed on the layer 300a, the conductive paths 310, and the waveguide 320. Next, a through-hole into which the conductive path 310 (for example, FIG. 2) is to be buried are formed in the layer 300b. The through-hole is formed by using the LSI technique, in particular lithography. Therefore, the through-holes can be aligned with high accuracy.

Next, the conductive path 310 is buried into the through-hole. The bumps 108, the semiconductor chip 400, the optical connector 500, and the optical fiber 510 are provided.

In the above-described way, the opto-electronic integrated circuit 10 illustrated in FIGS. 1 to 3 is manufactured.

Figure 21:
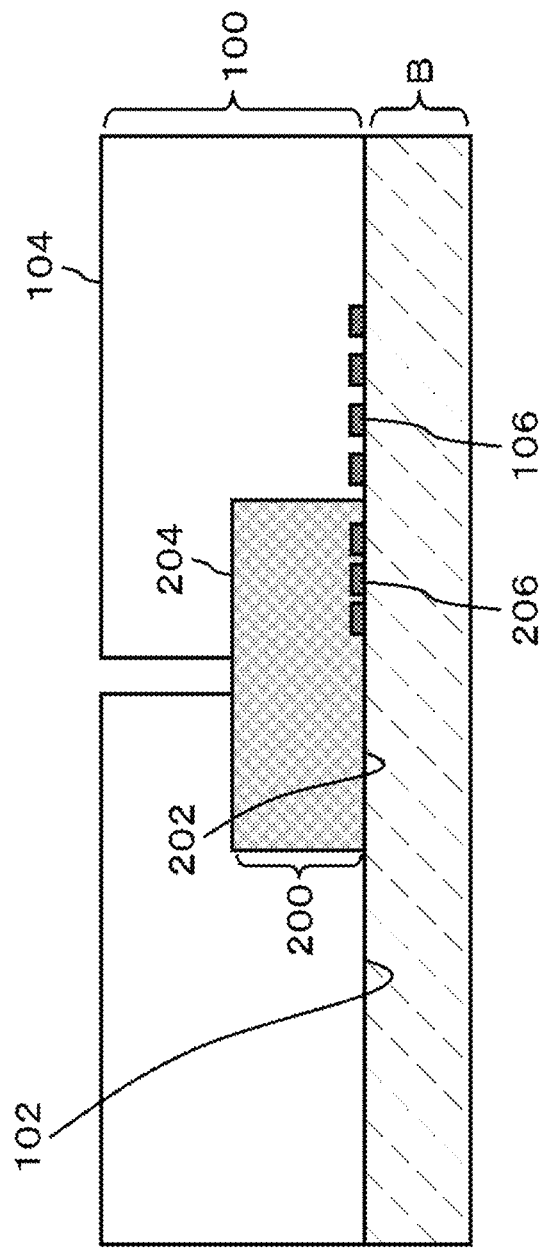
FIG. 21 is a diagram for explaining a second example of a method of manufacturing the opto-electronic integrated circuit illustrated in FIGS. 1 to 3.

FIG. 21 is a diagram for explaining a second example of a method of manufacturing the opto-electronic integrated circuit 10 illustrated in FIGS. 1 to 3. In this example, the opto-electronic integrated circuit 10 is manufactured as follows.

As illustrated in FIG. 21, the circuit board 100 and the semiconductor chip 200 are mounted on a support substrate B (for example, a glass substrate). An opening opened to the second surface 204 of the semiconductor chip 200 is formed in the second surface 104 of the circuit board 100. In this example, an uncured mold material is injected through the opening, then the mold material is cured, and the support substrate B is peeled off from the circuit board 100 and the semiconductor chip 200. Also in this method, the semiconductor chip 200 can be aligned by a recessed part of the circuit board 100, and the semiconductor chip 200 can be bonded to the circuit board 100 by the mold material. Therefore, the semiconductor chip 200 can be aligned with high accuracy.

The subsequent steps are the same as the steps in the examples described with reference to FIGS. 17 to 20.

Figure 22:
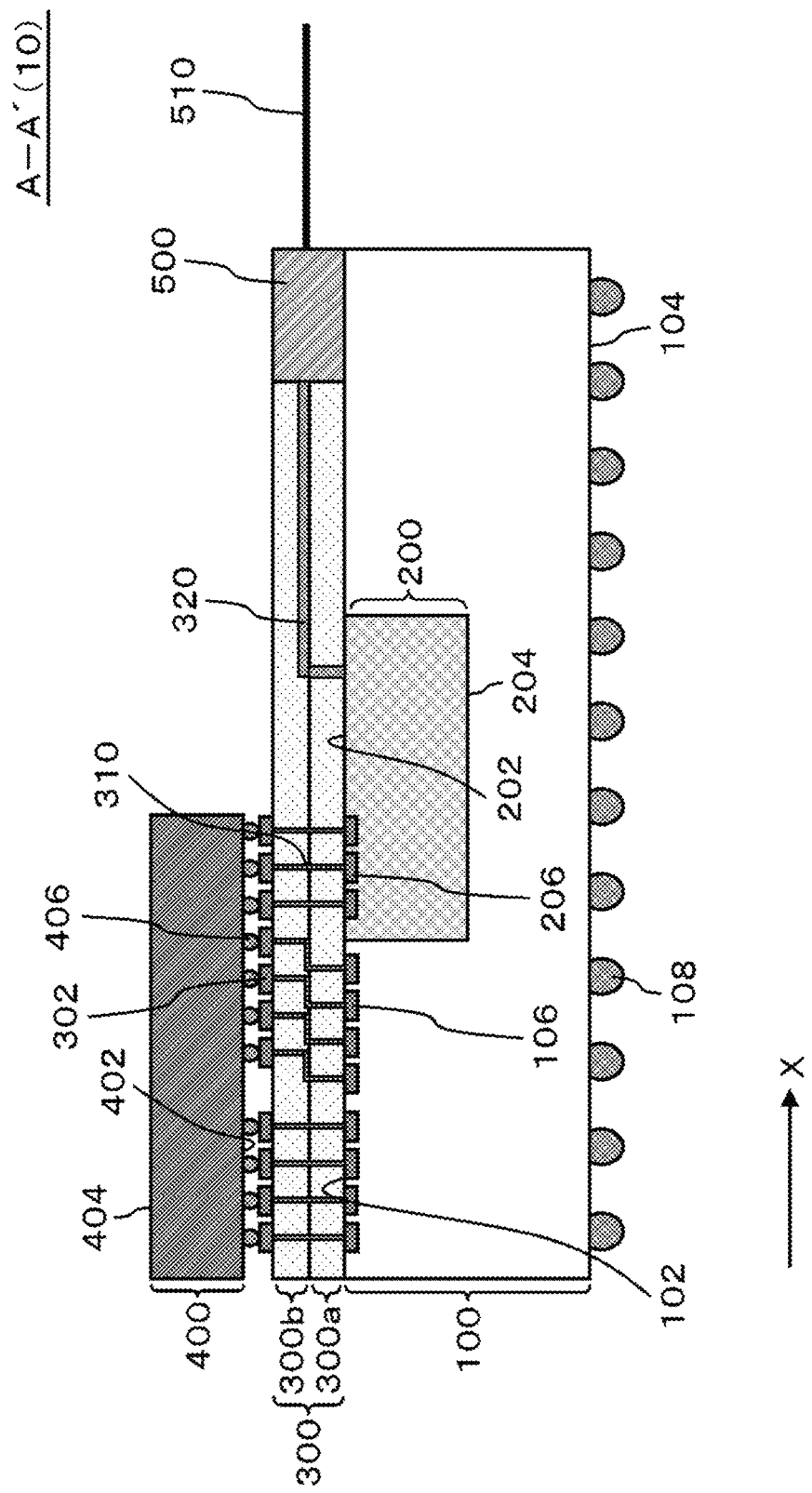
FIG. 22 is a diagram illustrating a first modification example related to FIG. 2.

FIG. 22 is a diagram illustrating a first modification example related to FIG. 2. In this example, the conductive path 310 electrically connected to the semiconductor chip 200 does not include a portion extending in the transverse direction with respect to the insulating layer 300, and includes only a via penetrating through both of the layer 300a and the layer 300b. In this example, the number of times of lithography for forming the conductive path 310 electrically connected to the semiconductor chip 200 can be reduced to only one after the layer 300a and the layer 300b are formed, and thus it is possible to simplify a manufacturing process of the opto-electronic integrated circuit 10.

Figure 23:
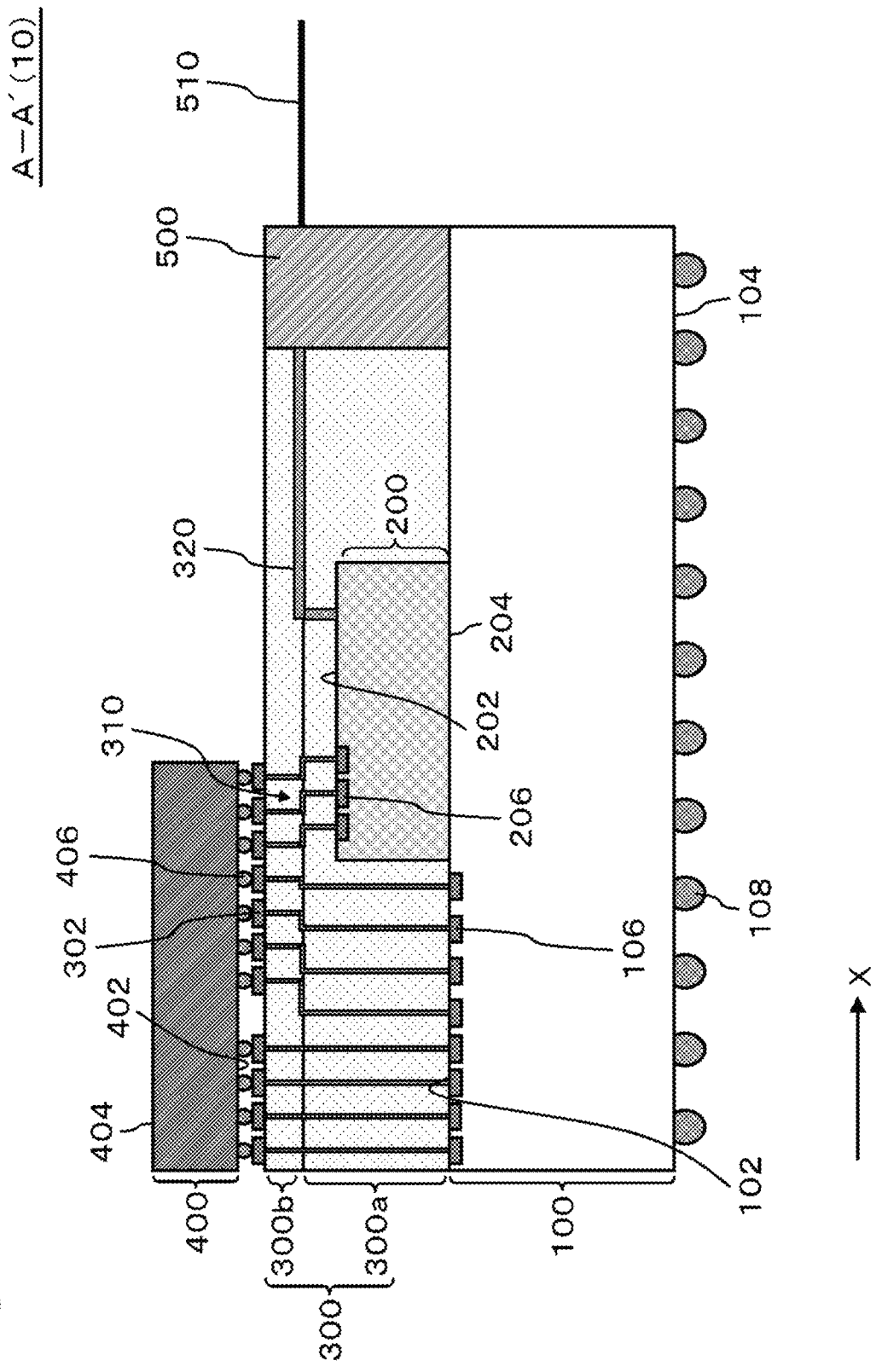
FIG. 23 is a diagram illustrating a second modification example related to FIG. 2.

FIG. 23 is a diagram illustrating a second modification example related to FIG. 2. In this example, the semiconductor chip 200 is not buried into the first surface 102 of the circuit board 100, and is mounted on the first surface 102 of the circuit board 100. In an example, the semiconductor chip 200 may be bonded to the circuit board 100 through an adhesive, in particular a die attach film (DAF) or a conductive paste. In this example, the circuit board 100 and the semiconductor chip 200 are integrated into each other through the insulating layer 300. Therefore, the semiconductor chip 200 can be aligned with high accuracy.

Embodiment 2

Figure 24:
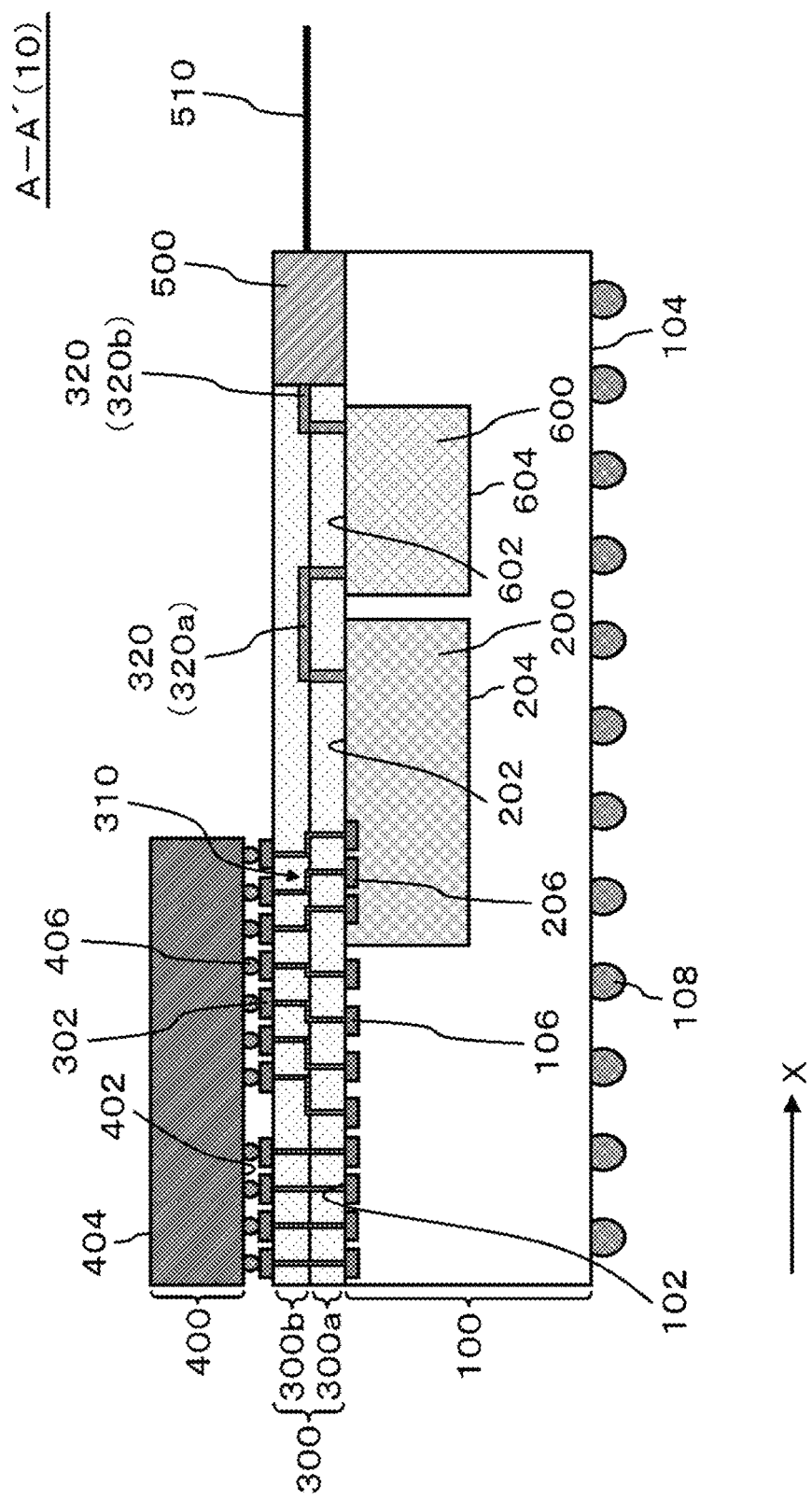
FIG. 24 is a sectional view illustrating an opto-electronic integrated circuit according to Embodiment 2.

FIG. 24 is a sectional view illustrating an opto-electronic integrated circuit 10 according to Embodiment 2, and corresponds to FIG. 2 in Embodiment 1. The opto-electronic integrated circuit 10 according to the present embodiment is the same as the opto-electronic integrated circuit 10 according to Embodiment 1 except for the following contents.

In the present embodiment, an optical functional element is mounted as a semiconductor chip 600 on the circuit board 100. Particularly, in the present embodiment, the semiconductor chip 600 functions as a wavelength-division multiplexing (WDM), and more specifically has an arrayed-waveguide grating (AWG). Therefore, it is not necessary to install the function of the semiconductor chip 600 in the semiconductor chip 200, and thus it is possible to simplify a manufacturing process of the semiconductor chip 200.

The semiconductor chip 600 has a first surface 602 and a second surface 604. The second surface 604 is opposite to the first surface 602. The semiconductor chip 600 is buried into the first surface 102 of the circuit board 100 such that the first surface 602 is exposed from the first surface 102 of the circuit board 100. Particularly, in the example illustrated in FIG. 24, the first surface 602 of the semiconductor chip 600 is substantially coplanar with the first surface 102 of the circuit board 100. The semiconductor chip 600 maybe buried into the circuit board 100 along with the semiconductor chip 200 in the same manner as in the example described with reference to FIG. 16 or FIG. 21.

The semiconductor chip 600 is optically coupled to the semiconductor chip 200 through the waveguide 320 (waveguide 320a). The waveguide 320a extends in the insulating layer 300 in the same manner as the waveguide 320 illustrated in FIG. 2.

The semiconductor chip 600 is optically coupled to the optical connector 500 through the waveguide 320 (waveguide 320b). The waveguide 320b extends in the insulating layer 300 in the same manner as the waveguide 320 illustrated in FIG. 2.

Figure 25:
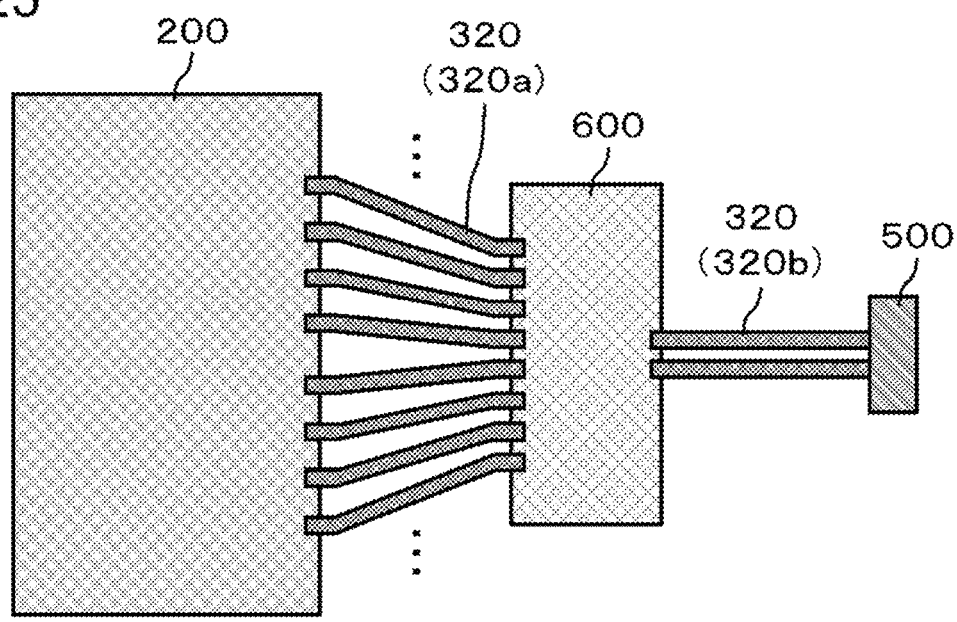
FIG. 25 is a diagram for explaining an example of details of a function of a semiconductor chip illustrated in FIG. 24.

FIG. 25 is a diagram for explaining an example of details of a function of the semiconductor chip 600 illustrated in FIG. 24. In this example, the number of waveguides 320a is larger than the number of waveguides 320b. In other words, the light from the semiconductor chip 200 is multiplexed by the semiconductor chip 600 to be sent to the optical connector 500, and the light from the optical connector 500 is demultiplexed by the semiconductor chip 600 to be sent to the semiconductor chip 200.

Figure 26:
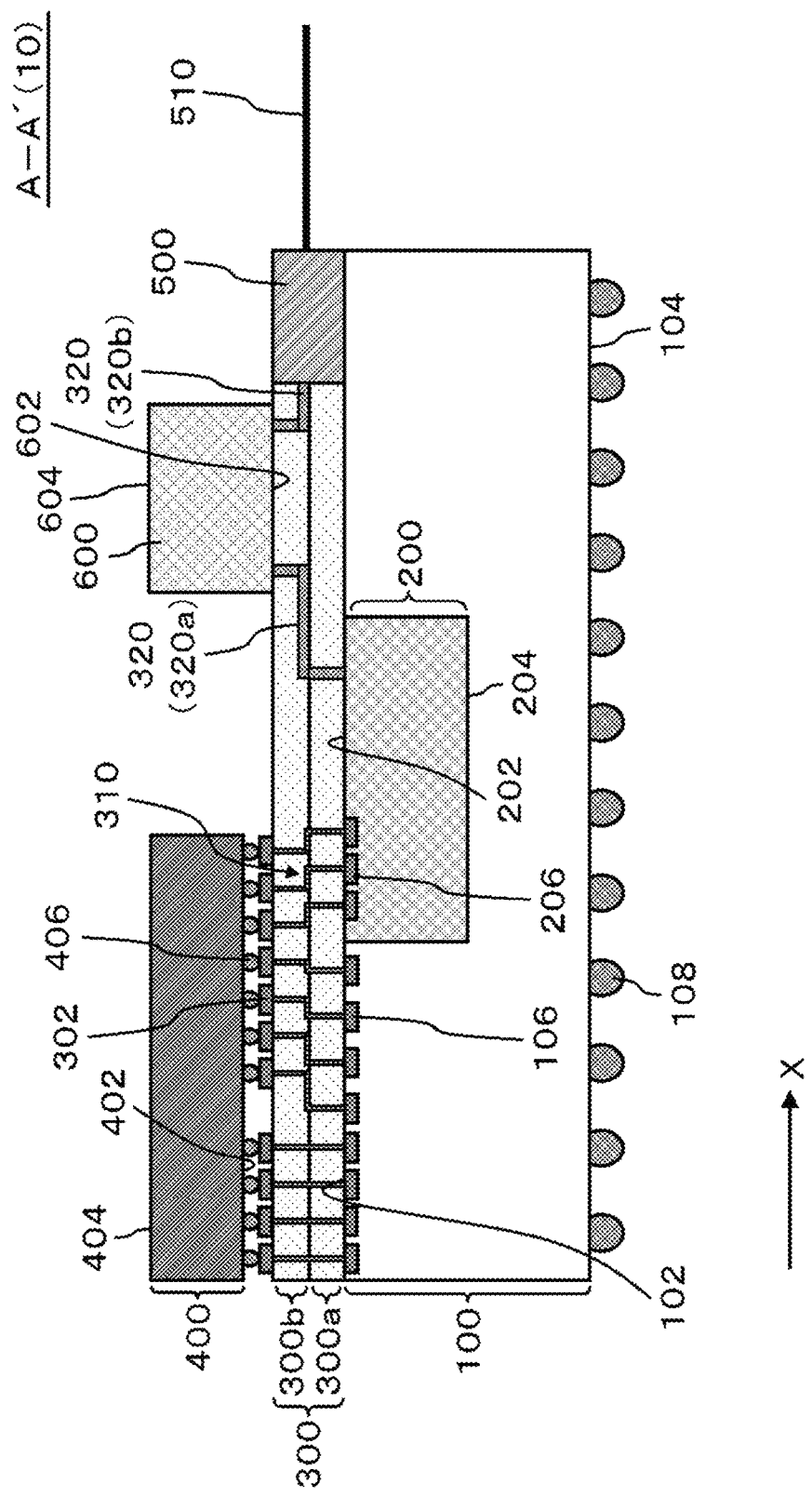
FIG. 26 is a diagram illustrating a modification example related to FIG. 24.

FIG. 26 is a diagram illustrating a modification example related to FIG. 24. In this example, the semiconductor chip 600 is not buried into the first surface 102 of the circuit board 100, and is mounted on the insulating layer 300. Also in this example, the semiconductor chip 600 may be optically coupled to the semiconductor chip 200 and the optical connector 500 through the waveguides extending in the insulating layer 300, that is, the waveguides 320a and the waveguides 320b.

Embodiment 3

Figure 27:
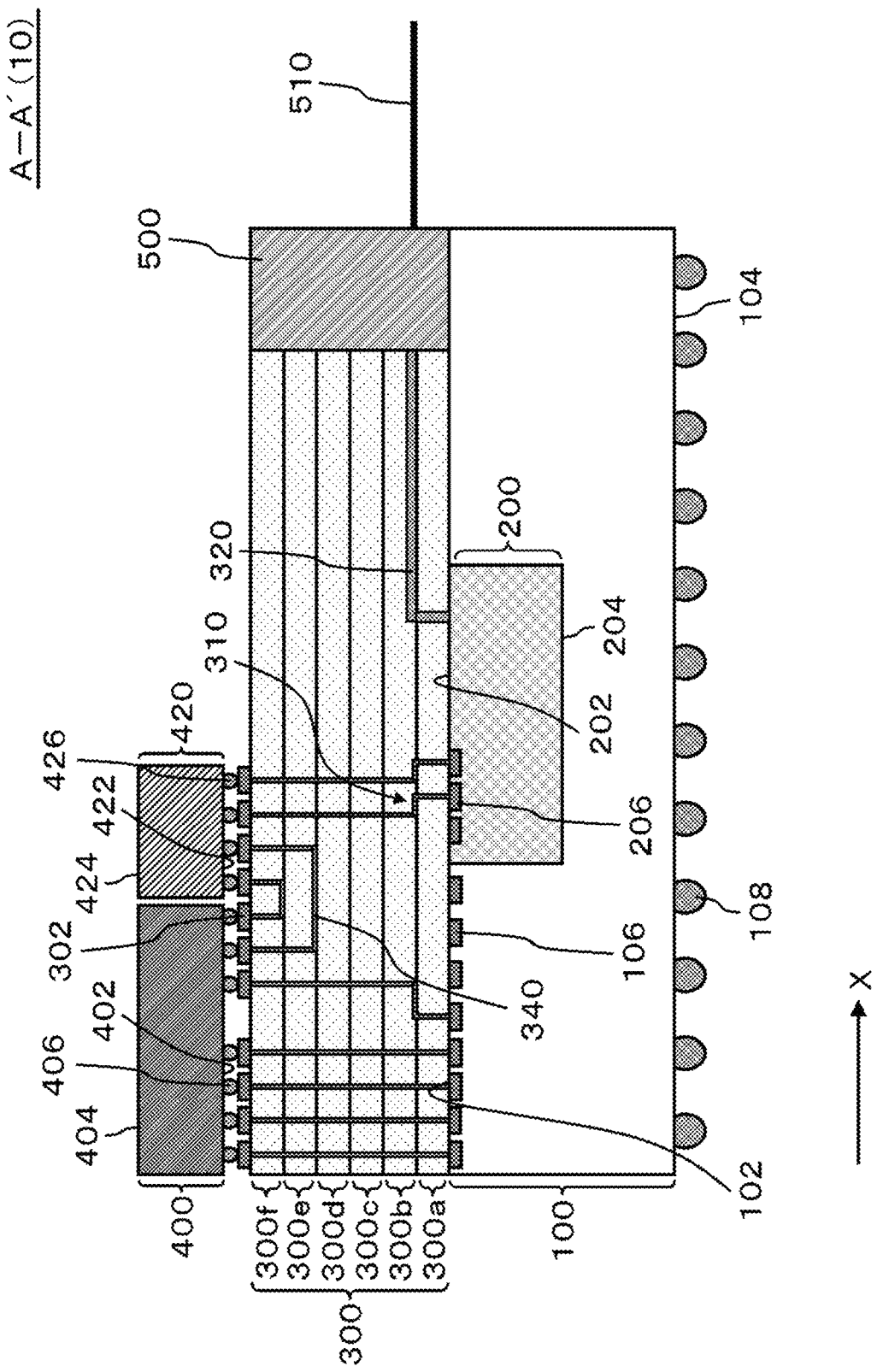
FIG. 27 is a sectional view illustrating an opto-electronic integrated circuit according to Embodiment 3.

FIG. 27 is a sectional view illustrating an opto-electronic integrated circuit 10 according to Embodiment 3, and corresponds to FIG. 2 in Embodiment 1. The opto-electronic integrated circuit 10 according to the present embodiment is the same as the opto-electronic integrated circuit 10 according to Embodiment 1 except for the following contents.

In the present embodiment, the insulating layer 300 has more than two layers, in particular six layers (a layer 300a, a layer 300b, a layer 300c, a layer 300d, a layer 300e, and a layer 300f). Therefore, a more complicated electrical connection structure can be formed in the insulating layer 300.

Particularly, in the present embodiment, the opto-electronic integrated circuit 10 includes a semiconductor chip 420. The semiconductor chip 420 is a transmission (TX) chip or a reception (RX) chip, and controls the semiconductor chip 200. The semiconductor chip 420 has a first surface 422 and a second surface 424. The second surface 424 is opposite to the first surface 422. The semiconductor chip 420 has a plurality of bumps 426 on the first surface 422. The semiconductor chip 420 is mounted on the insulating layer 300 such that the first surface 422 faces the first surface 102 of the circuit board 100. The semiconductor chip 420 is flip-chip mounted on the insulating layer 300, and each of the plurality of bumps 426 of the semiconductor chip 420 is connected to each of the plurality of electrodes 302 on the insulating layer 300.

The semiconductor chip 400 is electrically connected to the semiconductor chip 420 through a conductive path 340. In the same manner as the conductive path 310, the conductive path 340 extends in the insulating layer 300, and has a portion extending in the direction along the thickness of the insulating layer 300 (that is, a portion functioning as a via) and a portion extending in the transverse direction with respect to the thickness of the insulating layer 300. One end of the conductive path 340 is connected to the electrode 302 connected to the bump 406 of the semiconductor chip 400, and the other end of the conductive path 340 is connected to the electrode 302 connected to the bump 426 of the semiconductor chip 420.

The semiconductor chip 420 (second semiconductor chip) is electrically connected to the semiconductor chip 200 through the conductive path 310. One end of the conductive path 310 is connected to the electrode 302 connected to the bump 426 of the semiconductor chip 420, and the other end of the conductive path 310 is connected to the electrode 206 of the semiconductor chip 200.

Figure 28:
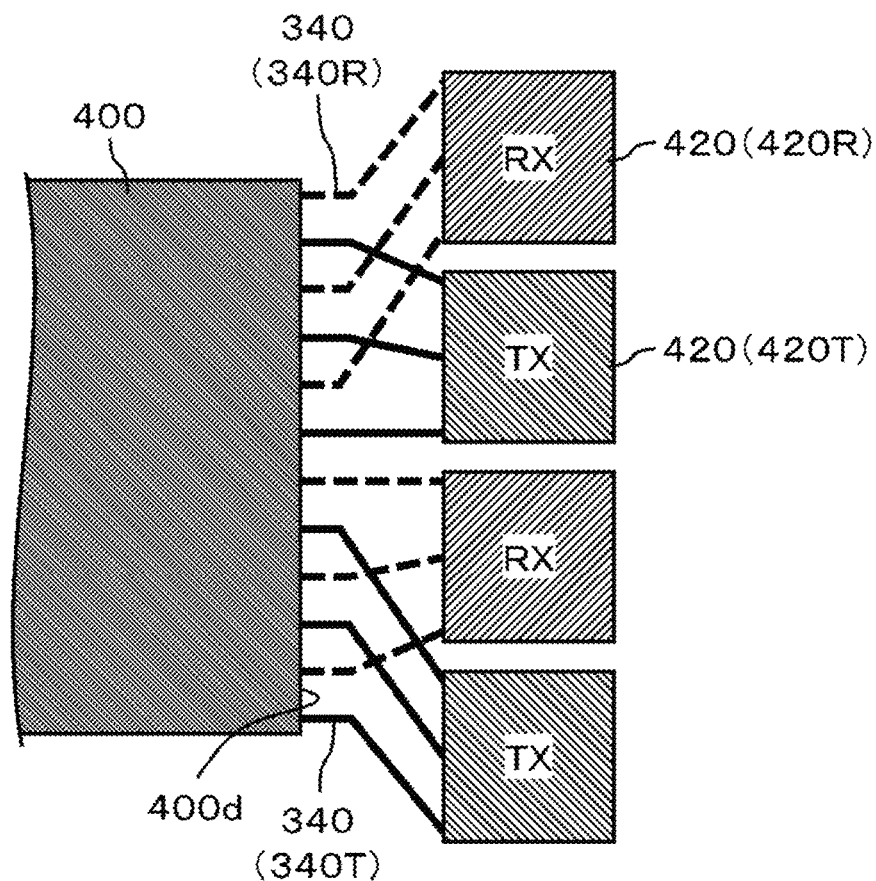
FIG. 28 is a diagram for explaining an example of details of a function of a semiconductor chip illustrated in FIG. 27.

FIG. 28 is a diagram for explaining an example of details of the semiconductor chip 420 illustrated in FIG. 27. In this example, a plurality of semiconductor chips 420 is arranged along the fourth side 400d of the semiconductor chip 400. The plurality of semiconductor chips 420 includes a plurality of transmission (TX) chips 420T and a plurality of reception (RX) chips 420R. The TX chips 420T and the RX chips 420R are alternately arranged. The semiconductor chip 400 has a plurality of input/outputs (I/Os) (for example, pads) arranged along the fourth side 400d, and the plurality of I/Os include TX I/Os and RX I/Os alternately arranged along the fourth side 400d. Each TX chip 420T is electrically connected to the TX I/O of the semiconductor chip 400 through the conductive path 340 (conductive path 340T), and each RX chip 420R is electrically connected to the RX I/O of the semiconductor chip 400 through the conductive path 340 (conductive path 340R). The number of channels of each semiconductor chip 420 (that is, the number of conductive paths 340 connected to each semiconductor chip 420) is three channels in the example illustrated in FIG. 26, but may be other than three channels in another example, such as sixteen channels. A transmission rate of each channel is, for example, 10 Gbps, 25 Gbps, 28 Gbps, 56 Gbps, or 100 Gbps.

Figure 29:
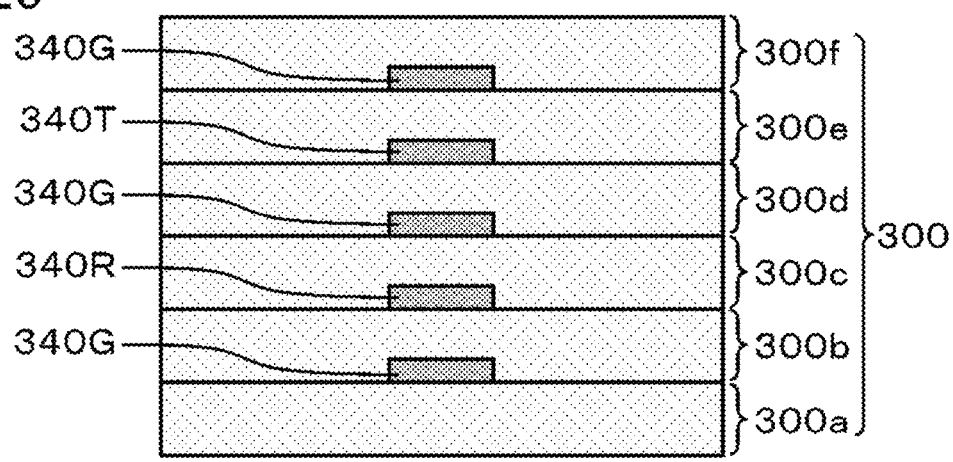
FIG. 29 is a diagram for explaining an example of a function of an insulating layer according to the examples illustrated in FIGS. 27 and 28.

FIG. 29 is a diagram for explaining an example of a function of the insulating layer 300 according to the examples illustrated in FIGS. 27 and 28. In this example, the conductive path 340T and the conductive path 340R may be electromagnetically shield by conductive paths 340G. Specifically, the conductive path 340G, the conductive path 340R, the conductive path 340G, the conductive path 340T, and the conductive path 340G are respectively covered with the layer 300*b*, the layer 300*c*, the layer 300*d*, the layer 300*e*, and the layer 300*f*. Therefore, an upper surface of the conductive path 340T is covered with the conductive path 340G in the layer 300*f*, and a lower surface of the conductive path 340R is covered with the conductive path 340G in the layer 300*b*. Thus, the conductive path 340T and the conductive path 340R are separated from each other by the conductive path 340G in the layer 300*d*. A specific potential, in particular a ground potential is applied to each conductive path 340G. Therefore, the conductive path 340T and the conductive path 340R can be electromagnetically shielded by the conductive path 340G.

Figure 30:
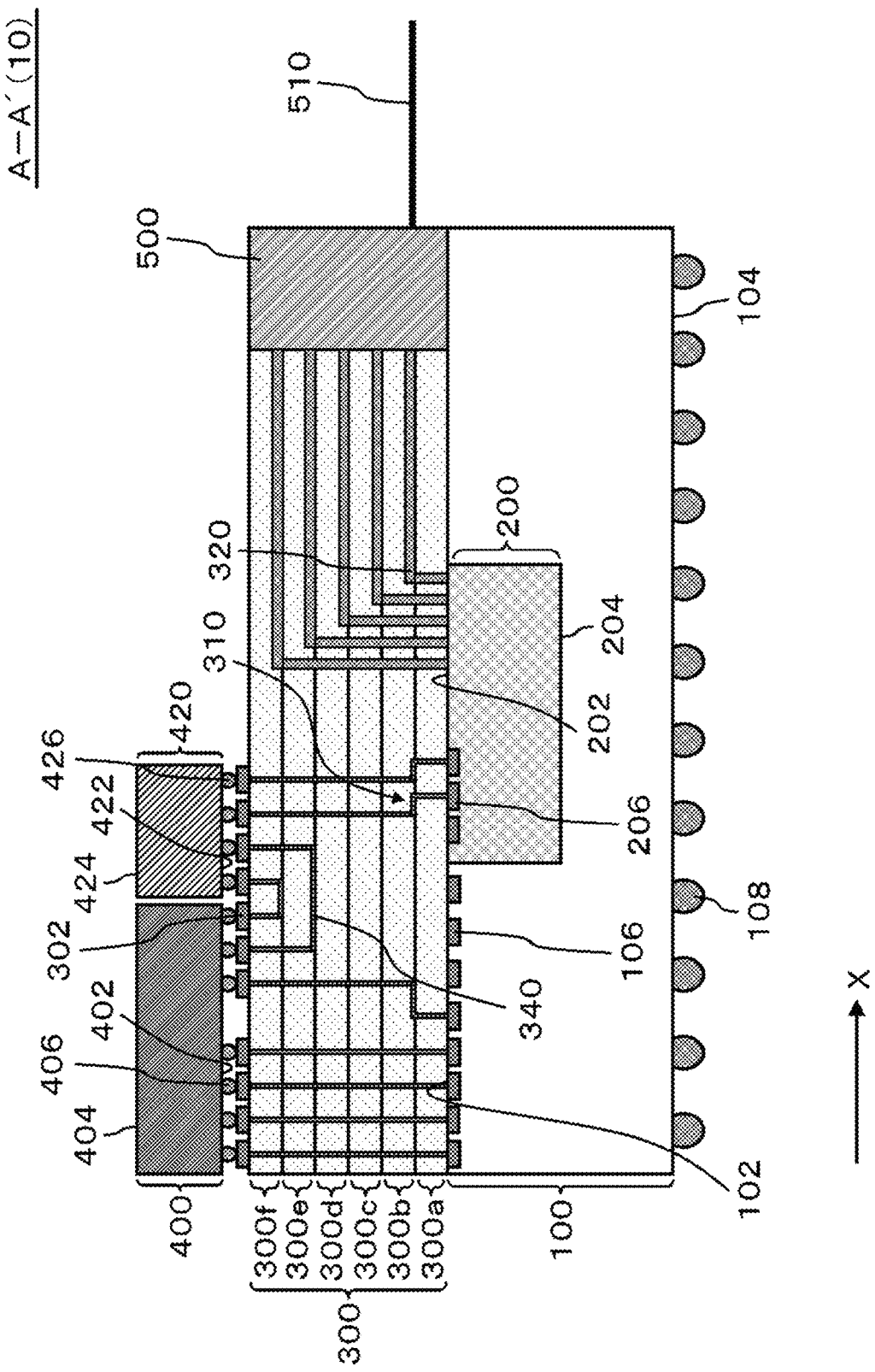
FIG. 30 is a diagram illustrating a modification example related to FIG. 27.

FIG. 30 is a diagram illustrating a modification example related to FIG. 27. In this example, each of a plurality of waveguides 320 is provided in each of a plurality of layers from the layer 300*b* to the layer 300*f* of the insulating layer 300. In this example, the plurality of waveguides 320 can be overlapped each other in the direction along the thickness of the insulating layer 300, and thus more waveguides 320 can be provided.

Embodiment 4

Figure 31:
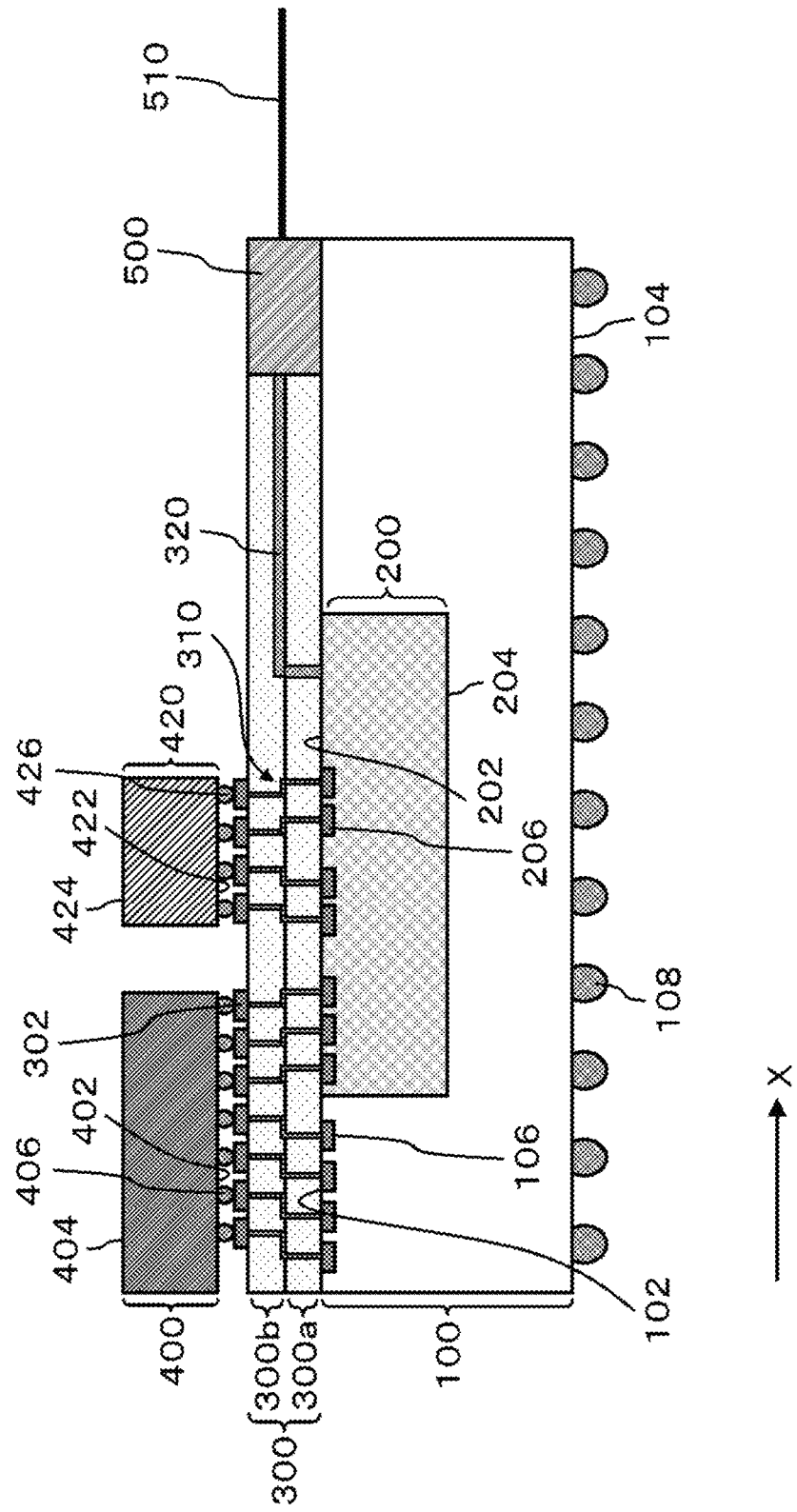
FIG. 31 is a sectional view illustrating an opto-electronic integrated circuit according to Embodiment 4.

FIG. 31 is a sectional view illustrating an opto-electronic integrated circuit 10 according to Embodiment 4, and corresponds to FIG. 27 in Embodiment 3. The opto-electronic integrated circuit 10 according to the present embodiment is the same as the opto-electronic integrated circuit 10 according to Embodiment 3 except for the following contents.

The semiconductor chip 420 is not directly electrically connected to the semiconductor chip 400, that is, a conductive path that electrically connects the semiconductor chip 420 to the semiconductor chip 400 is not provided in the insulating layer 300. The semiconductor chip 200 is electrically connected to the semiconductor chip 420 through one conductive path 310, and is electrically connected to the semiconductor chip 400 through another conductive path 310. The semiconductor chip 400 and the semiconductor chip 420 may be electrically connected to each other through the semiconductor chip 200, and may not be connected to each other.

In an example, the semiconductor chip 420 is a driver IC. In this example, the semiconductor chip 200 is driven by the semiconductor chip 420.

In another example, the semiconductor chip 420 is a transimpedance amplifier (TIA). In this example, the semiconductor chip 420 converts a photocurrent generated in the semiconductor chip 200 into a voltage, and the semiconductor chip 200 receives a voltage (signal) converted in the semiconductor chip 420, and sends the voltage to the semiconductor chip 400.

Embodiment 5

Figure 32:
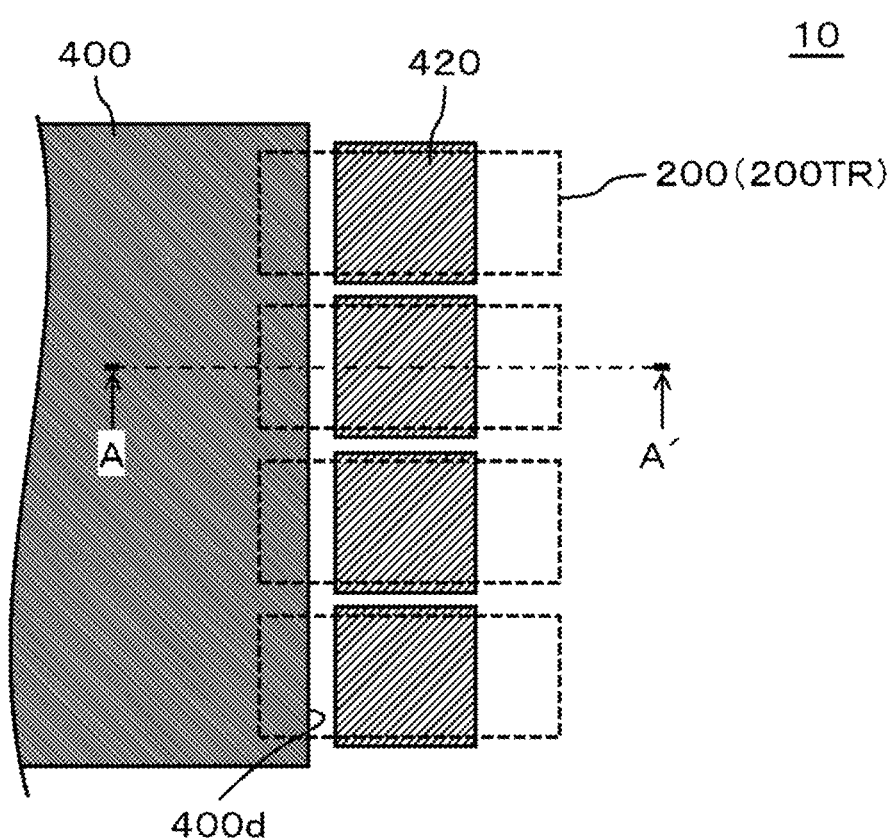
FIG. 32 is a plan view illustrating main portions of an opto-electronic integrated circuit according to Embodiment 5.
Figure 33:
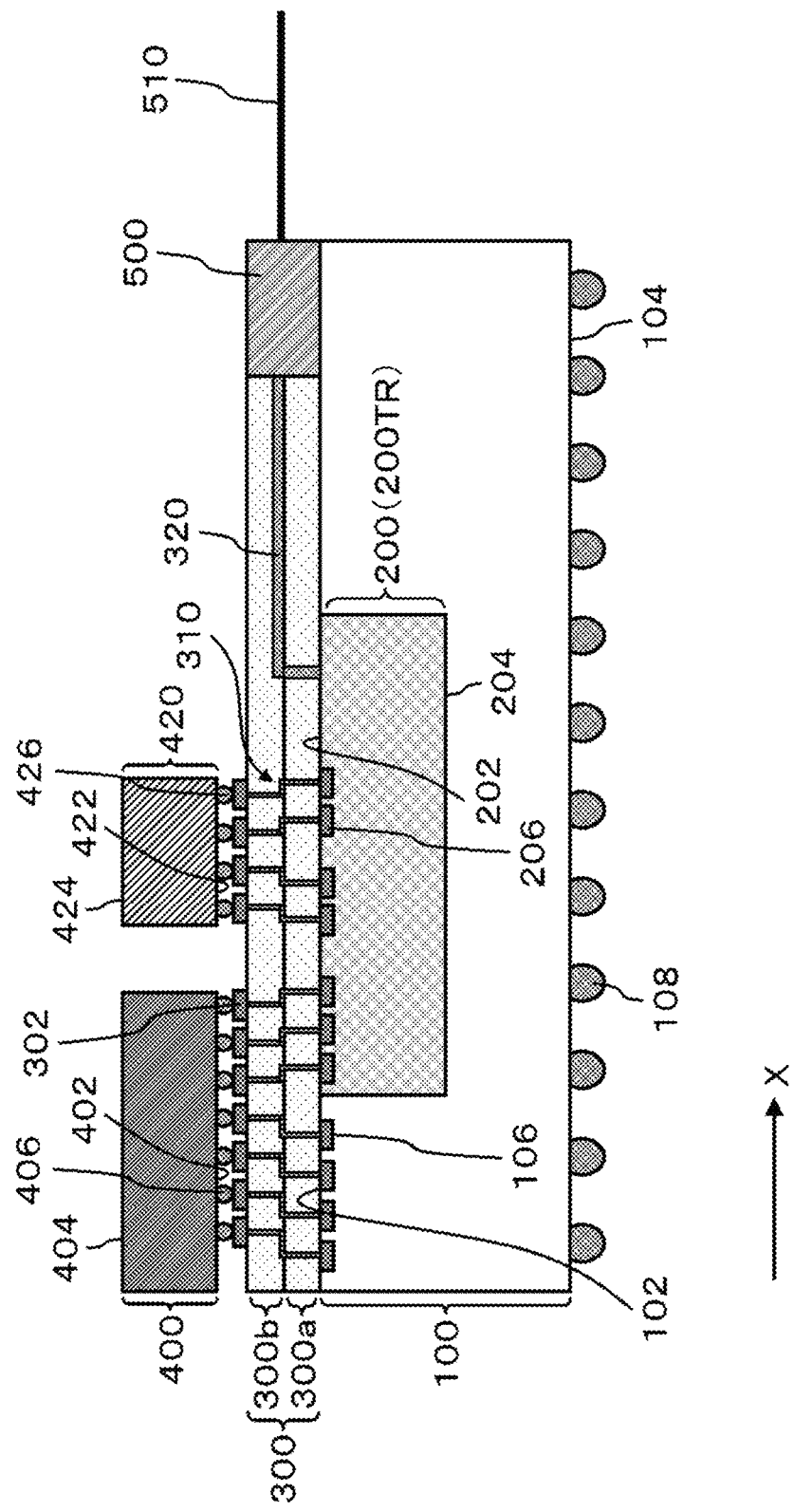
FIG. 33 is a sectional view taken along the line A-A' in FIG. 32.

FIG. 32 is a plan view illustrating main portions of an opto-electronic integrated circuit 10 according to Embodiment 5. FIG. 33 is a sectional view taken along the line A-A' in FIG. 32. The opto-electronic integrated circuit 10 according to the present embodiment is the same as the opto-electronic integrated circuit 10 according to Embodiment 4 except for the following contents.

In the present embodiment, the semiconductor chip 200 is a transmission/reception (TRX) chip 200TR, and the semiconductor chip 420 has both of a driver IC and a TIA. Therefore, the semiconductor chip 200 (TRX chip 200TR) can transmit or receive light according to the control of the semiconductor chip 420, and the semiconductor chip 420 can convert a photocurrent generated in the semiconductor chip 200 into a voltage.

In the example illustrated in FIG. 32, a plurality of semiconductor chips 200 is arranged along the fourth side 400*d* of the semiconductor chip 400, and each of the plurality of semiconductor chips 420 overlaps each of the plurality of semiconductor chips 200.

In the example illustrated in FIG. 33, the semiconductor chip 420 is electrically connected to the semiconductor chip 200 through one conductive path 310, and the semiconductor chip 400 is electrically connected to the semiconductor chip 200 through another conductive path 310. The number of channels of the semiconductor chip 200 (that is, the number of conductive paths 310 connecting the semiconductor chip 200 to the semiconductor chip 400) may be, for example, sixteen channels. A transmission rate of each channel is, for example, 10 Gbps, 25 Gbps, 28 Gbps, 56 Gbps, or 100 Gbps.

Embodiment 6

Figure 34:
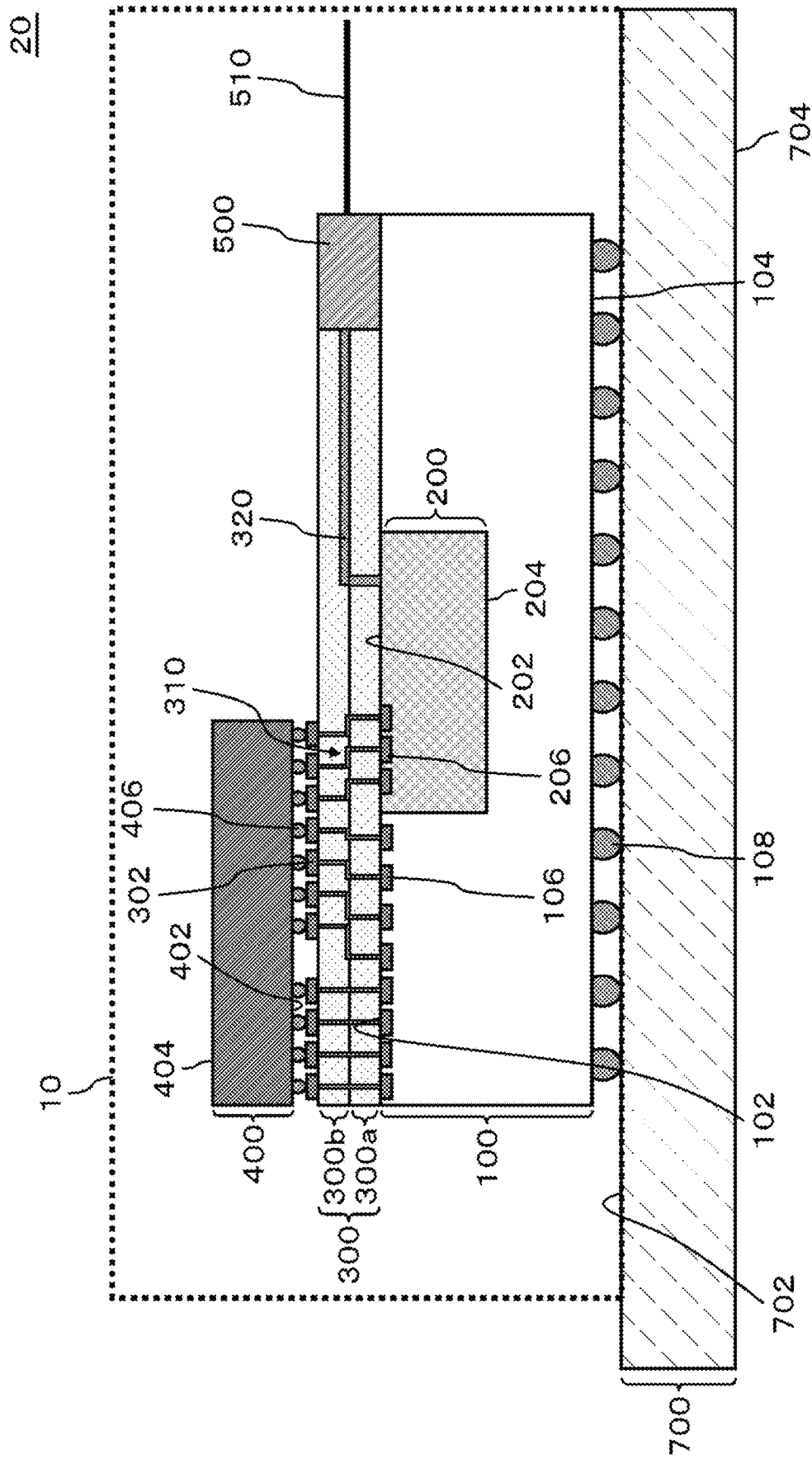
FIG. 34 is a sectional view illustrating a computing device according to Embodiment 6.

FIG. 34 is a sectional view illustrating a computing device 20 according to Embodiment 6.

The computing device 20 includes the opto-electronic integrated circuit 10 and a system board 700 (motherboard). The opto-electronic integrated circuit 10 according to the present embodiment is the opto-electronic integrated circuit 10 according to Embodiment 1. The system board 700 has a main surface 702 and a rear surface 704. The rear surface 704 is opposite to the main surface 702. The opto-electronic integrated circuit 10 is mounted on the system board 700 such that the second surface 104 of the circuit board 100 faces the main surface 702 of the system board 700. Each bump 108 of the circuit board 100 is connected to the system board 700, and the opto-electronic integrated circuit 10 can receive power or a control signal from the system board 700 through the bumps 108.

As mentioned above, the embodiments of the present invention have been described with reference to the drawings, but these are only examples of the present invention, and may employ various configurations other than the described configurations.

This application claims the priority based on Japanese Patent Application No. 2017-089878, filed Apr. 28, 2017; the entire contents of which are incorporated herein by reference.

The invention claimed is:

1. An opto-electronic integrated circuit comprising:
a circuit board having a first surface;
a first semiconductor chip buried into the first surface of the circuit board and bonded to the circuit board through a mold material;
an insulating layer covering the first surface of the circuit board and the first semiconductor chip;
a waveguide optically coupled to the first semiconductor chip and extending in the insulating layer; and
a first via electrically connected to the first semiconductor chip, the first via being buried into a first portion of the insulating layer, the first portion of the insulating layer overlapping the first semiconductor chip.

2. The opto-electronic integrated circuit according to claim 1, further comprising:
a second semiconductor chip over the insulating layer; and a second via electrically connected to the second semiconductor chip, the second via being buried into a second portion of the insulating layer, the second portion of the insulating layer overlapping the second semiconductor chip,
wherein the first via and the second via are electrically connected to each other.

3. The opto-electronic integrated circuit according to claim 2, further comprising:
a third via electrically connected to the circuit board, the third via being buried into a third portion of the insulating layer, the third portion of the insulating layer overlapping the circuit board, the first via and third via being arranged in a predetermined direction;
a fourth via electrically connected to the second semiconductor chip, the fourth via being buried into a fourth portion of the insulating layer, the fourth portion of the insulating layer being overlapping the second semiconductor chip, the second via and the fourth via being arranged in the predetermined direction,
wherein the third via and the fourth via are electrically connected to each other,
wherein a distance between the second via and the fourth via in the predetermined direction is shorter than a distance between first via and the third via in the predetermined direction.

4. A computing device comprising:
a system board having a main surface; and
an opto-electronic integrated circuit located over the main surface of the system board,
wherein the opto-electronic integrated circuit comprises:
a circuit board having a first surface and a second surface opposite to the first surface, the circuit board being mounted over the system board such that the second surface faces the main surface of the system board;
a first semiconductor chip buried into the first surface of the circuit board and bonded to the circuit board through a mold material;
an insulating layer covering the first surface of the circuit board and the first semiconductor chip;
a waveguide optically coupled to the first semiconductor chip and extending in the insulating layer; and
a first via electrically connected to the first semiconductor chip, the first via being buried into a first portion of the insulating layer, the first portion of the insulating layer overlapping the first semiconductor chip.

5. The opto-electronic integrated circuit according to claim 1, further comprising:
a second semiconductor chip over the insulating layer,
wherein the first semiconductor chip and the second semiconductor chip are electrically connected through the first via.

* * * * *